US012652815B2

(12) United States Patent
Chang et al.

(10) Patent No.: US 12,652,815 B2
(45) Date of Patent: Jun. 9, 2026

(54) METHOD FOR FORMING SEMICONDUCTOR DEVICE STRUCTURE WITH OXIDE STRUCTURE

(71) Applicant: Taiwan Semiconductor Manufacturing Company, Ltd., Hsinchu (TW)

(72) Inventors: Chun-Yi Chang, Hsinchu City (TW); Hsiao-Chu Chen, Caotun Township (TW); Hong-Chih Chen, Changhua County (TW); Hsin-Che Chiang, Taipei City (TW); Chun-Sheng Liang, Puyan Township, Changhua County (TW); Kuo-Hua Pan, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 859 days.

(21) Appl. No.: 17/843,004

(22) Filed: Jun. 17, 2022

(65) Prior Publication Data

US 2023/0411497 A1     Dec. 21, 2023

(51) Int. Cl.
| | |
|---|---|
| *H10D 30/01* | (2025.01) |
| *H10D 30/62* | (2025.01) |
| *H10D 64/01* | (2025.01) |
| *H10D 84/83* | (2025.01) |

(52) U.S. Cl.
CPC ....... *H10D 30/024* (2025.01); *H10D 30/6211* (2025.01); *H10D 64/021* (2025.01); *H10D 84/834* (2025.01)

(58) Field of Classification Search
CPC ............. H10D 30/024; H10D 30/6211; H10D 64/021; H10D 84/834; H10D 30/797; H10D 30/62; H10D 64/017; H10D 62/822; H10D 64/518; H01L 21/28114
See application file for complete search history.

(56) References Cited

U.S. PATENT DOCUMENTS

| | | | |
|---|---|---|---|
| 2019/0393325 A1* | 12/2019 | Chang .................. | H10D 30/024 |
| 2020/0105537 A1* | 4/2020 | Wang ................ | H01L 21/31116 |
| 2020/0381537 A1* | 12/2020 | Lin ...................... | H10D 30/797 |

OTHER PUBLICATIONS

Inductively Coupled Plasma etching of amorphous silicon nanostructures over nanotopography using C4F8/SF6 chemistry Harvey-collard et al (Year: 2012).*

* cited by examiner

*Primary Examiner* — Britt Hanley

*Assistant Examiner* — William C. Trice, III

(74) *Attorney, Agent, or Firm* — McClure, Qualey & Rodack, LLP

(57)          ABSTRACT

A method for forming a semiconductor device structure is provided. The method includes forming a first gate stack over a substrate. The first gate stack includes a first gate electrode and a dielectric layer between the first gate electrode and the substrate, and the first gate electrode has a void. The method includes oxidizing a side portion of the first gate electrode to form an oxide layer over the first gate electrode. The oxide layer fills the void.

20 Claims, 34 Drawing Sheets

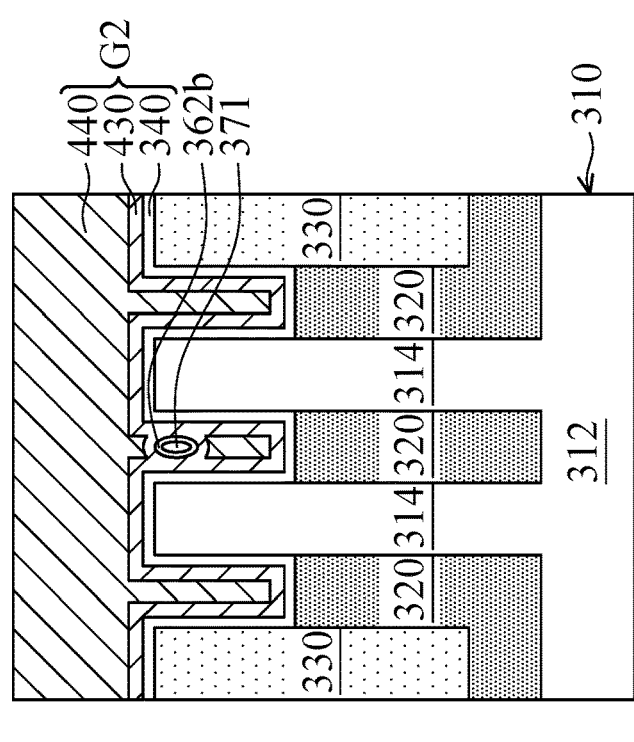
FIG. 2I-4
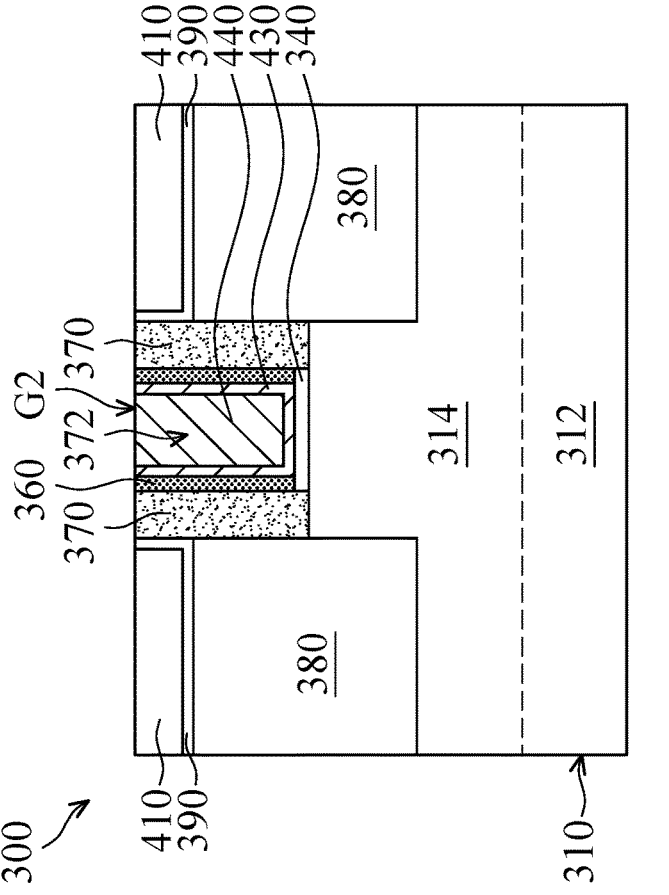
FIG. 2I-3

METHOD FOR FORMING SEMICONDUCTOR DEVICE STRUCTURE WITH OXIDE STRUCTURE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1D-1 is a cross-sectional view illustrating the semiconductor device structure along a sectional line I-I in FIG. 1D, in accordance with some embodiments.

FIG. 1D-2 is a cross-sectional view illustrating the semiconductor device structure along a sectional line II-II in FIG. 1D, in accordance with some embodiments.

FIG. 1E-1 is a cross-sectional view illustrating the semiconductor device structure along a sectional line I-I in FIG. 1E, in accordance with some embodiments.

FIG. 1E-2 is a cross-sectional view illustrating the semiconductor device structure along a sectional line II-II in FIG. 1E, in accordance with some embodiments.

FIG. 1G-1 is a cross-sectional view illustrating the semiconductor device structure along a sectional line I-I in FIG. 1G, in accordance with some embodiments.

FIG. 1G-2 is a cross-sectional view illustrating the semiconductor device structure along a sectional line II-II in FIG. 1G, in accordance with some embodiments.

FIG. 1H-1 is a cross-sectional view illustrating the semiconductor device structure along a sectional line I-I in FIG. 1H, in accordance with some embodiments.

FIG. 1H-2 is a cross-sectional view illustrating the semiconductor device structure along a sectional line II-II in FIG. 1H, in accordance with some embodiments.

FIG. 1I-1 is a cross-sectional view illustrating the semiconductor device structure along a sectional line I-I in FIG. 1I, in accordance with some embodiments.

FIG. 1I-2 is a cross-sectional view illustrating the semiconductor device structure along a sectional line II-II in FIG. 1I, in accordance with some embodiments.

FIG. 1I-3 is a cross-sectional view illustrating the semiconductor device structure along a sectional line III-III in FIG. 1I, in accordance with some embodiments.

FIG. 1I-4 is a cross-sectional view illustrating the semiconductor device structure along a sectional line IV-IV in FIG. 1I, in accordance with some embodiments.

FIG. 2D-1 is a cross-sectional view illustrating the semiconductor device structure along a sectional line I-I in FIG. 2D, in accordance with some embodiments.

FIG. 2D-2 is a cross-sectional view illustrating the semiconductor device structure along a sectional line II-II in FIG. 2D, in accordance with some embodiments.

FIG. 2E-1 is a cross-sectional view illustrating the semiconductor device structure along a sectional line I-I in FIG. 2E, in accordance with some embodiments.

FIG. 2E-2 is a cross-sectional view illustrating the semiconductor device structure along a sectional line II-II in FIG. 2E, in accordance with some embodiments.

FIG. 2G-1 is a cross-sectional view illustrating the semiconductor device structure along a sectional line I-I in FIG. 2G, in accordance with some embodiments.

FIG. 2G-2 is a cross-sectional view illustrating the semiconductor device structure along a sectional line II-II in FIG. 2G, in accordance with some embodiments.

FIG. 2H-1 is a cross-sectional view illustrating the semiconductor device structure along a sectional line I-I in FIG. 2H, in accordance with some embodiments.

FIG. 2H-2 is a cross-sectional view illustrating the semiconductor device structure along a sectional line II-II in FIG. 2H, in accordance with some embodiments.

FIG. 2I-1 is a cross-sectional view illustrating the semiconductor device structure along a sectional line I-I in FIG. 2I, in accordance with some embodiments.

FIG. 2I-2 is a cross-sectional view illustrating the semiconductor device structure along a sectional line II-II in FIG. 2I, in accordance with some embodiments.

FIG. 2I-3 is a cross-sectional view illustrating the semiconductor device structure along a sectional line III-III in FIG. 2I, in accordance with some embodiments.

FIG. 2I-4 is a cross-sectional view illustrating the semiconductor device structure along a sectional line IV-IV in FIG. 2I, in accordance with some embodiments.

FIG. 3B-1 is a cross-sectional view illustrating the semiconductor device structure along a sectional line I-I in FIG. 3B, in accordance with some embodiments.

FIG. 3B-2 is a cross-sectional view illustrating the semiconductor device structure along a sectional line II-II in FIG. 3B, in accordance with some embodiments.

FIG. 3B-3 is a cross-sectional view illustrating the semiconductor device structure along a sectional line III-III in FIG. 3B, in accordance with some embodiments.

DETAILED DESCRIPTION

Figure 1A:
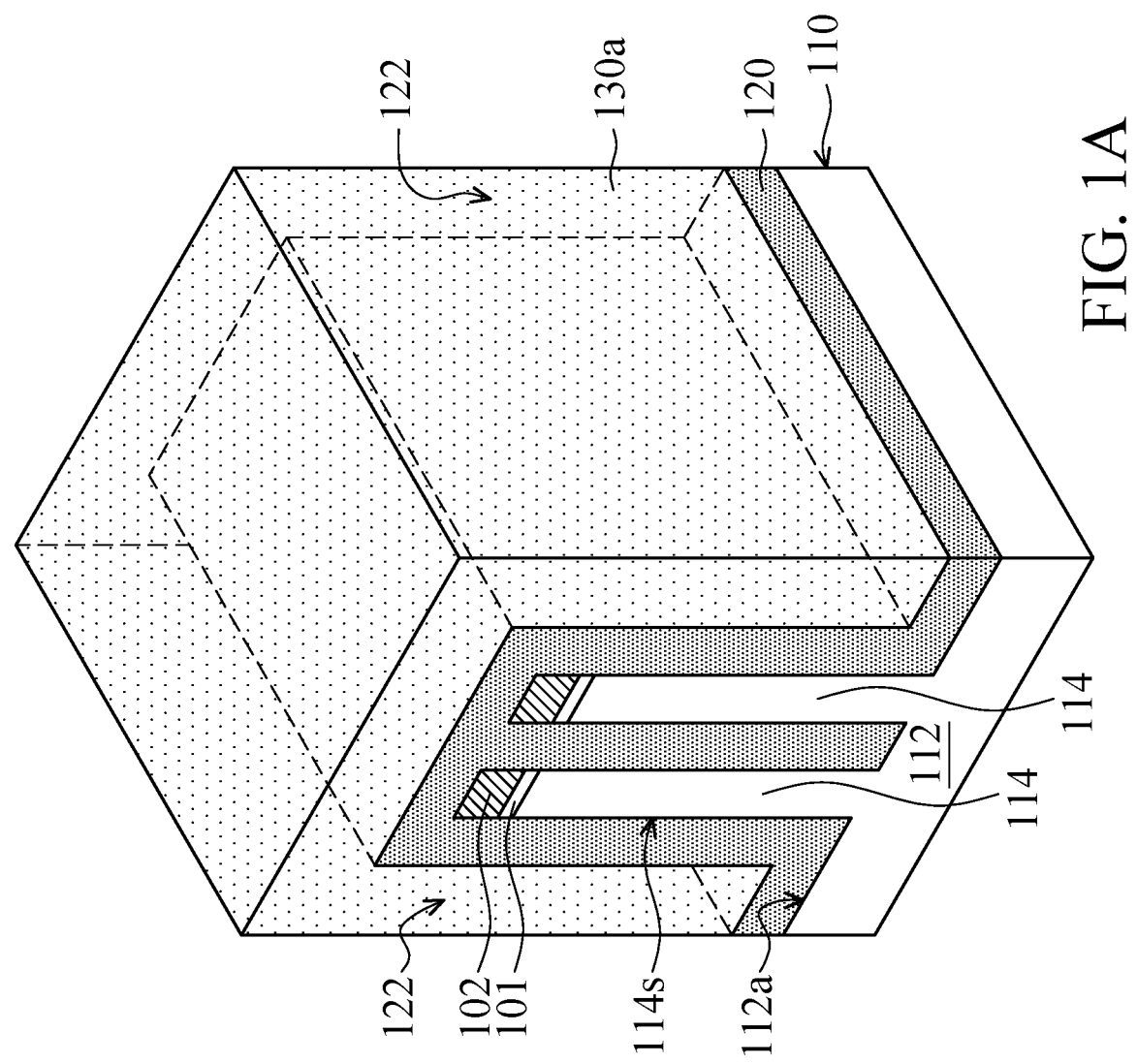
FIGS. 1A-1I are perspective views of various stages of a process for forming a semiconductor device structure, in accordance with some embodiments.
Figure 1B:
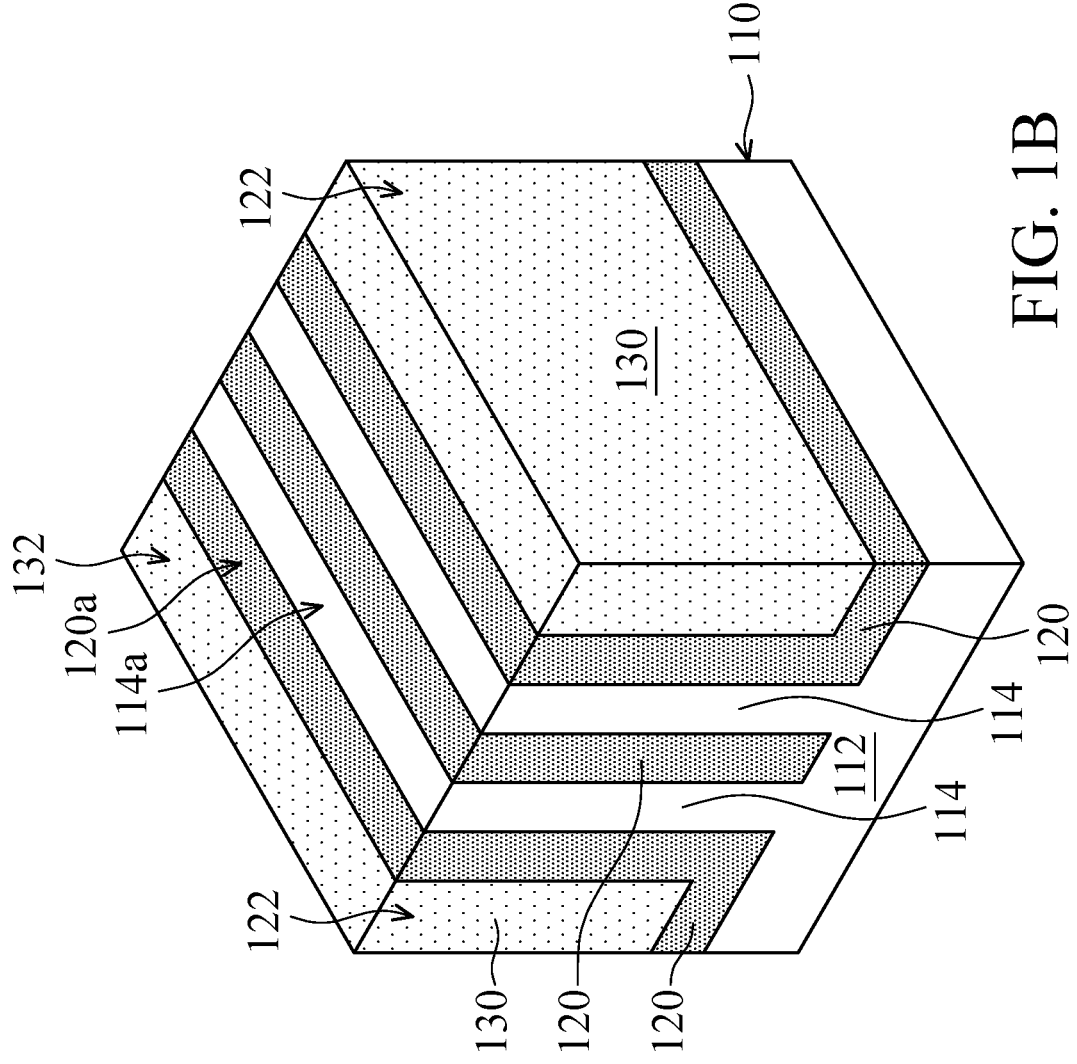

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. Source/drain region(s) or source/drain structures may refer to a source or a drain, individually or collectively dependent upon the context.

FIGS. 1A-1I are perspective views of various stages of a process for forming a semiconductor device structure, in accordance with some embodiments. As shown in FIG. 1A, a substrate 110 is provided, in accordance with some embodiments. The substrate 110 includes, for example, a semiconductor substrate. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

Thereafter, as shown in FIG. 1A, mask layers 101 and 102 are successively formed over the substrate 110, in accordance with some embodiments. In some embodiments, the mask layer 101 serves a buffer layer or an adhesion layer that is formed between the underlying substrate 110 and the overlying mask layer 102. The mask layer 101 may also be used as an etch stop layer when the mask layer 102 is removed or etched.

In some embodiments, the mask layer 101 is made of silicon oxide. In some embodiments, the mask layer 101 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, or another applicable process.

The mask layers 101 and 102 are made of different materials, in accordance with some embodiments. In some embodiments, the mask layer 102 is made of silicon nitride, silicon oxynitride, silicon oxide, or another applicable material. In some embodiments, the mask layer 102 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, or another applicable process.

After the formation of the mask layers 101 and 102, the mask layer 101 and the overlying mask layer 102 are patterned by a photolithography process and an etching process, so as to expose portions of the substrate 110.

For example, the photolithography process may include photoresist coating (e.g., spin-on coating), soft baking, mask aligning, exposure, post-exposure baking, developing the photoresist, rinsing and drying (e.g., hard baking). Moreover, the etching process may be a dry etching process, such as a reactive ion etching (RIE) process, an neutral beam etching (NBE) process, the like, or a combination thereof.

Afterwards, as shown in FIG. 1A, an etching process is performed on the substrate 110 by using the patterned mask layers 101 and 102 as an etch mask, in accordance with some embodiments. After the etching process, the substrate 110 has a base 112 and fins 114, in accordance with some embodiments. The fins 114 are over the base 112, in accordance with some embodiments. The fins 114 are spaced apart from each other, in accordance with some embodiments.

In some embodiments, the etching process includes a dry etching process. In some embodiments, the substrate 110 is etched by a dry etching process, such as an RIE process, an NBE process, the like, or a combination thereof.

The fin 114 has sidewalls 114s, in accordance with some embodiments. The base 112 has a top surface 112a, in accordance with some embodiments. In some embodiments, the sidewalls 114s are substantially perpendicular to the top surface 112a. In some other embodiments (not shown), the sidewalls 114s are sloped sidewalls with respect to the top surface 112a.

As shown in FIG. 1A, a dielectric layer 120 is deposited over the base 112, the fins 114, and the mask layers 101 and 102, in accordance with some embodiments. The dielectric layer 120 conformally covers the base 112, the fins 114, and the mask layers 101 and 102, in accordance with some embodiments.

In some embodiments, the dielectric layer 120 is made of oxide (such as silicon oxide), fluorosilicate glass (FSG), a low-k dielectric material, and/or another suitable dielectric material. The dielectric layer 120 may be deposited by an atomic layer deposition (ALD) process, a chemical vapor deposition (CVD) process, or another applicable process.

As shown in FIG. 1A, a dielectric layer 130a is formed over the dielectric layer 120, in accordance with some embodiments. The trenches 122 of the dielectric layer 120 are filled with the dielectric layer 130a, in accordance with some embodiments.

The dielectric layer 130a is made of oxide (e.g., silicon oxide), nitride (e.g., silicon nitride, silicon carbon nitride, silicon oxycarbon nitride, titanium nitride, or tantalum nitride), carbide (e.g., silicon oxycarbide), metal oxide (e.g., oxides of Li, Be, Mg, Ca, Sr, Sc, Y, Zr, Al, La, Ce, Pr, Nd, Sm, Eu, Gd, Tb, Dy, Ho, Hf, Er, Tm, Yb, Lu, and/or mixtures thereof), or another suitable insulating material, in accordance with some embodiments.

In some embodiments, the dielectric layers 120 and 130a are made of different materials with different etching rates under an etchant. The dielectric layer 130a is formed using a deposition process, such as a chemical vapor deposition (CVD) process, an atomic layer deposition (ALD) process, or a physical vapor deposition (PVD) process, in accordance with some embodiments.

Figure 1C:
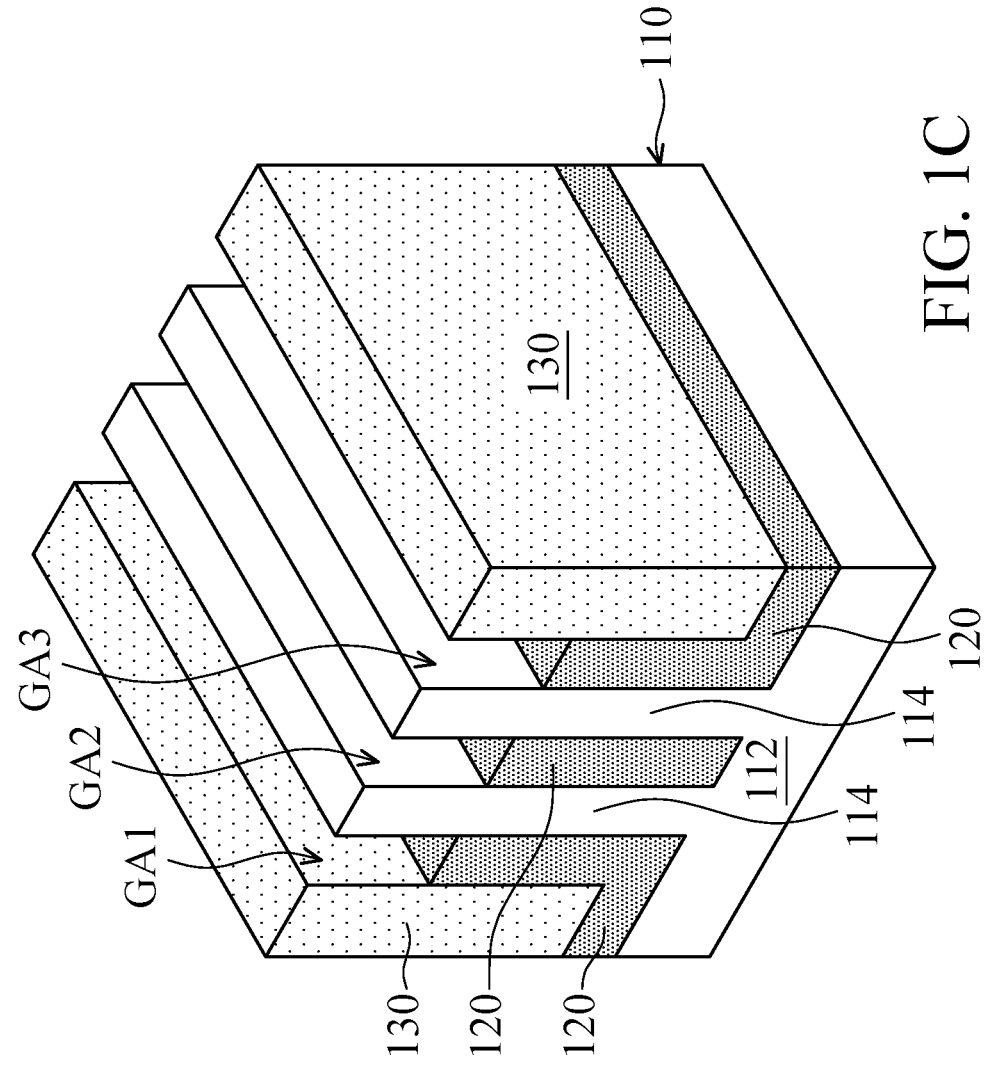
Figure 1D:
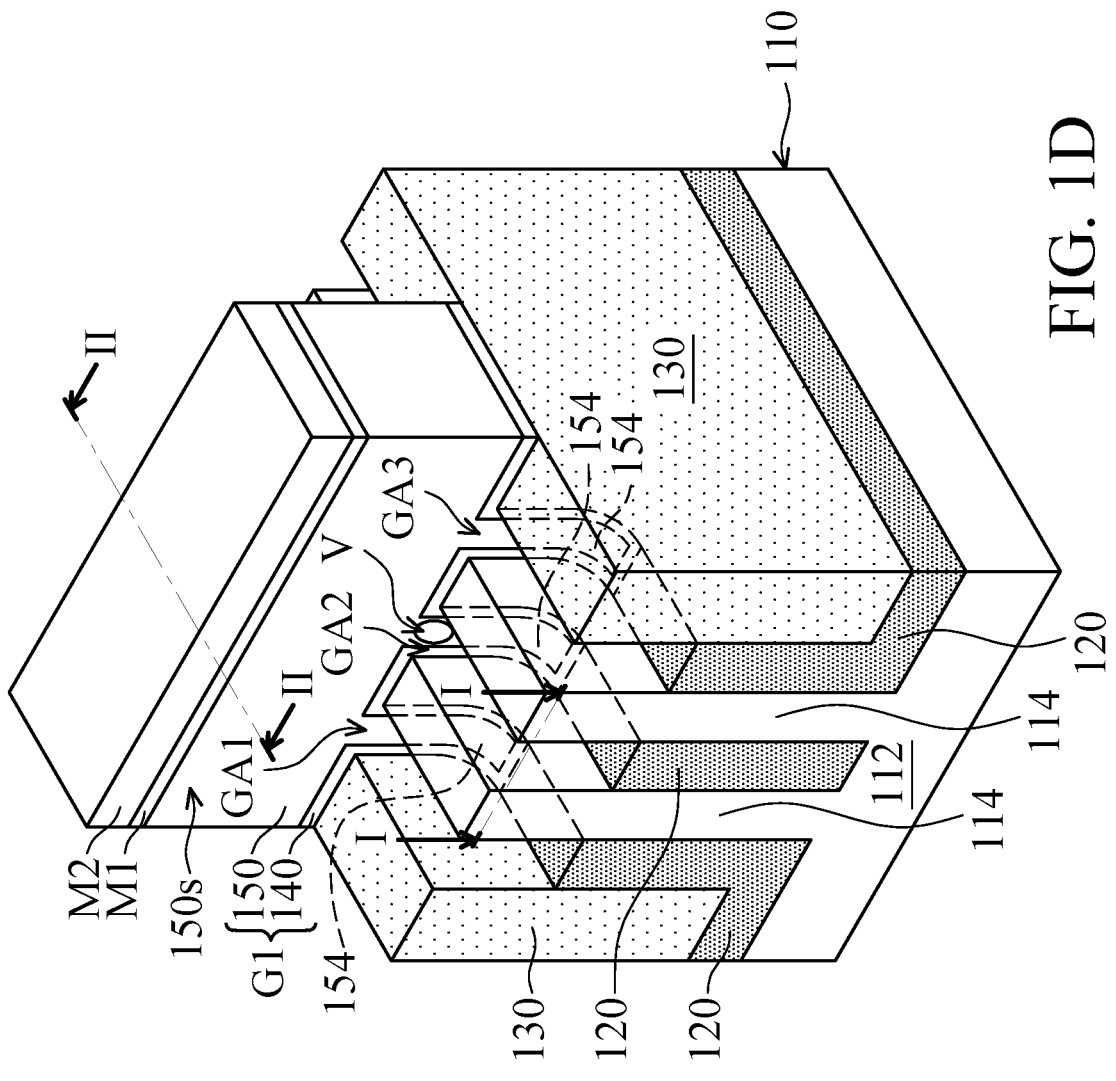
Figures 1, 1D, 2:
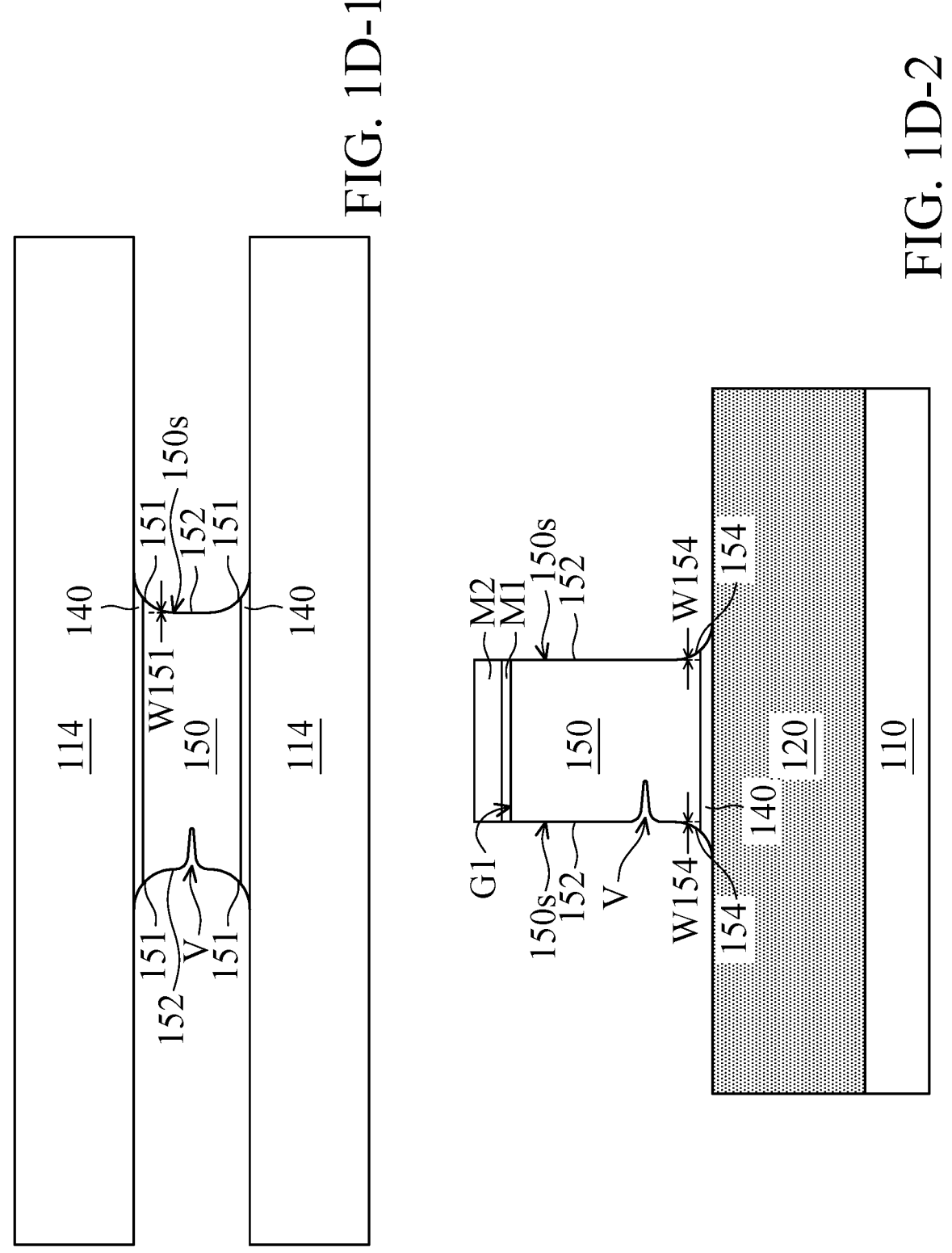

As shown in FIGS. 1A and 1, top portions of the dielectric layers 120 and 130a and the mask layers 101 and 102 are removed, in accordance with some embodiments. In some embodiments, top portions of the fins 114 are also removed.

After the removal process, the dielectric layer 130a remaining in the trenches 122 of the dielectric layer 120 forms dielectric fins 130, in accordance with some embodiments. The dielectric fins 130 are separated from each other by the fins 114 and the dielectric layer 120, in accordance with some embodiments.

In some embodiments, top surfaces 132, 114a, and 120a of the dielectric fins 130, the fins 114, and the dielectric layer 120 are substantially coplanar with (or aligned with) each other, in accordance with some embodiments. The term "substantially coplanar" in the application may include small deviations from coplanar geometries. The deviations may be due to manufacturing processes.

The removal process includes performing a thinning process on a top surface of the dielectric layer 130a, in accordance with some embodiments. The thinning process includes a chemical mechanical polishing (CMP) process, in accordance with some embodiments.

As shown in FIG. 1C, upper portions of the dielectric layer 120 are removed, in accordance with some embodiments. After the removal process, gaps GA1, GA2, and GA3 are formed between the dielectric fins 130 and the fins 114, in accordance with some embodiments.

The aspect ratio of the gap GA1, GA2, or GA3 is high, in accordance with some embodiments. The aspect ratio of the gap GA1, GA2, or GA3 ranges from about 3 to about 10, in accordance with some embodiments. The removal process includes an etching process, in accordance with some embodiments. The etching process includes a dry etching process or a wet etching process, in accordance with some embodiments.

As shown in FIG. 1D, a gate dielectric layer 140, a gate electrode 150, and mask layers M1 and M2 are formed over the fins 114, the dielectric layer 120, and the dielectric fins 130, in accordance with some embodiments. The gate dielectric layer 140 and the gate electrode 150 together form a gate stack G1, in accordance with some embodiments.

The gate dielectric layer 140 conformally and partially covers the fins 114, the dielectric layer 120, and the dielectric fins 130, in accordance with some embodiments. The gate electrode 150 is over the gate dielectric layer 140, in accordance with some embodiments.

The formation of the gate dielectric layer 140, the gate electrode 150, and the mask layers M1 and M2 includes: depositing a gate dielectric material layer (not shown) over the fins 114, the dielectric layer 120, and the dielectric fins 130; depositing a gate electrode (not shown) over the gate dielectric material layer; forming the mask layer M1 over the gate electrode; forming the mask layer M2 over the mask layer M1; and removing the gate dielectric material layer and the gate electrode, which are not covered by the mask layers M1 and M2, in accordance with some embodiments.

The remaining gate electrode forms the gate electrode 150, in accordance with some embodiments. The remaining gate dielectric material layer forms the gate dielectric layer 140, in accordance with some embodiments. The removal process includes an etching process, in accordance with some embodiments.

FIG. 1D-1 is a cross-sectional view illustrating the semiconductor device structure along a sectional line I-I in FIG. 1D, in accordance with some embodiments. FIG. 1D-2 is a cross-sectional view illustrating the semiconductor device structure along a sectional line II-II in FIG. 1D, in accordance with some embodiments.

As shown in FIGS. 1D, 1D-1, and 1D-2, the gate electrode 150 has corner portions 151, side portions 152, and footing portions 154, in accordance with some embodiments. The corner portions 151 are close to the fins 114, in accordance with some embodiments.

In some embodiments, a width W151 of the corner portion 151 increases toward the closest fin 114. Since the etch rate of the gate electrode 150 close to the fins 114 is less than the etch rate of the middle portion of the gate electrode 150 between the fins 114, the corner portions 151 are formed after the etching process for forming the gate electrode 150, in accordance with some embodiments. As shown in FIG. 1D-1, the gate electrode 150 has a bamboo-like shape, in accordance with some embodiments.

As shown in FIGS. 1D, 1D-1, and 1D-2, the gate electrode 150 has a void V, in accordance with some embodiments. The void V is in the side portion 152, in accordance with some embodiments. The void V is between the fins 114, in accordance with some embodiments. In some other embodiments (not shown), the void V is between the fin 114 and the dielectric fin 130.

The aspect ratios of the gaps GA1, GA2, and GA3 are high, which adversely affects the formation of the gate electrode 150 in the gaps GA1, GA2, and GA3, in accordance with some embodiments. Therefore, the void V tends to form in the gap GA1, GA2, or GA3, in accordance with some embodiments.

As shown in FIGS. 1D and 1D-2, the footing portions 154 are close to the gate dielectric layer 140, the dielectric layer 120, and the substrate 110, in accordance with some embodiments. In some embodiments, a width W154 of the footing portion 154 increases toward the substrate 110.

Since the aspect ratios of the gaps GA1, GA2, and GA3 are high, the etch rate of the bottom portion of the gate electrode 150 is less than the etch rate of the middle portion and the top portion of the gate electrode 150, in accordance with some embodiments. Therefore, the footing portions 154 are formed after the etching process for forming the gate electrode 150, in accordance with some embodiments.

The gate dielectric layer 140 is made of an insulating material, such as oxide (e.g., silicon oxide), in accordance with some embodiments. The gate electrode 150 is made of a semiconductor material (e.g. polysilicon), in accordance with some embodiments.

In some embodiments, the mask layer M1 serves a buffer layer or an adhesion layer that is formed between the underlying gate electrode 150 and the overlying mask layer M2. The mask layer M1 may also be used as an etch stop layer when the mask layer M2 is removed or etched.

In some embodiments, the mask layer M1 is made of silicon oxide. The mask layers M1 and M2 are made of different materials, in accordance with some embodiments. In some embodiments, the mask layer M2 is made of silicon nitride, silicon oxynitride, silicon oxide, or another applicable material.

Figure 1E:
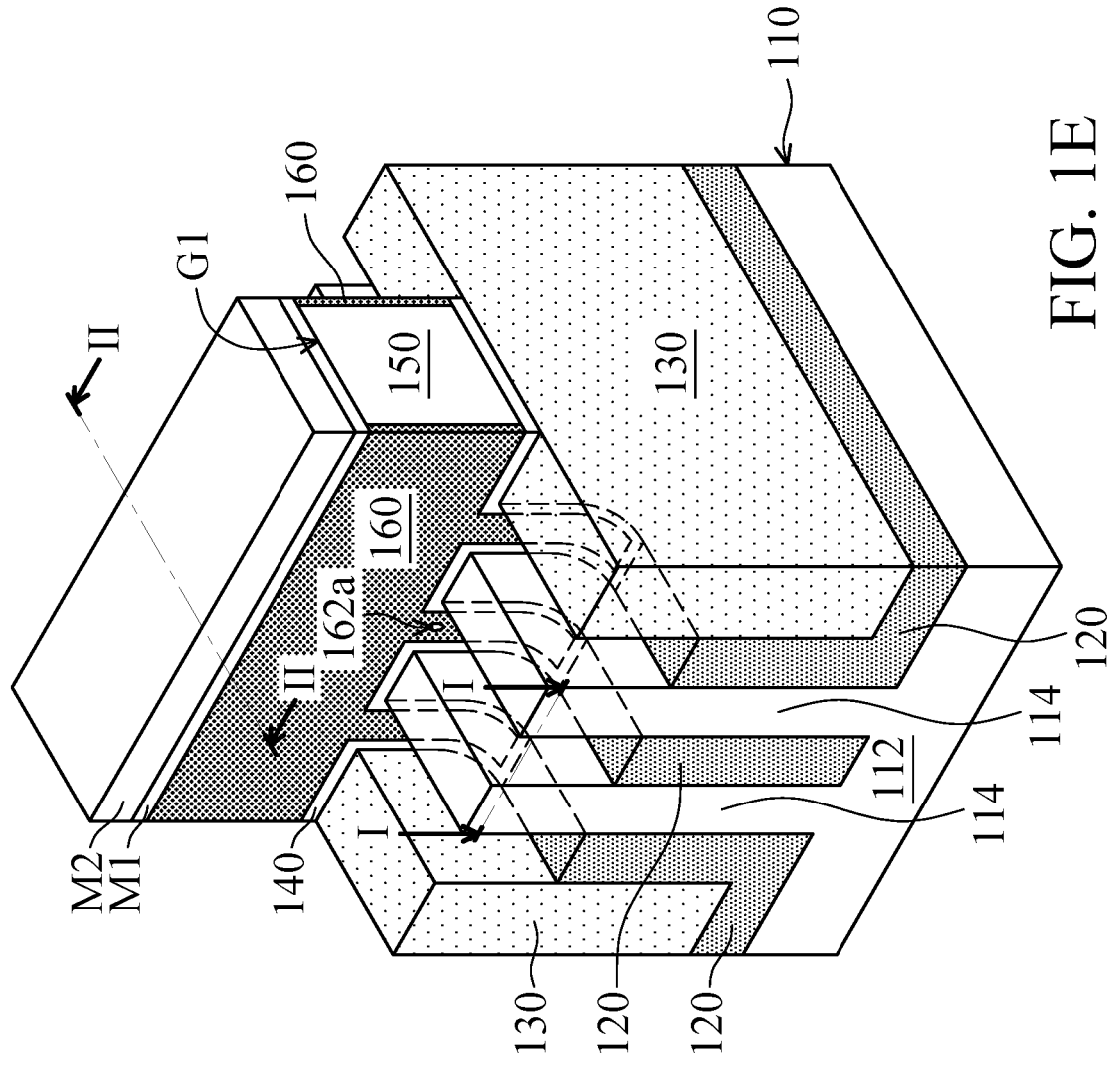
Figures 1, 1E, 2:
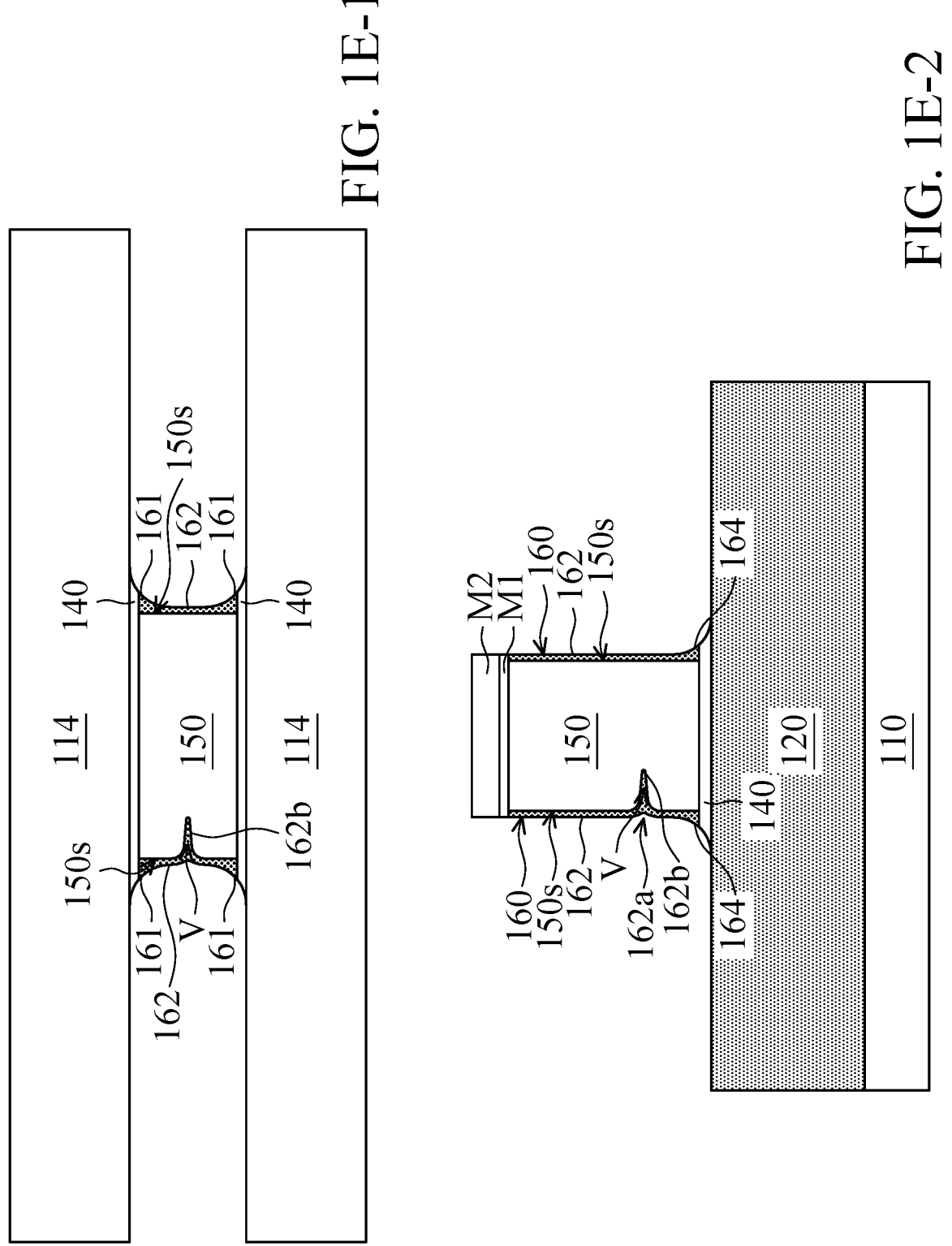

FIG. 1E-1 is a cross-sectional view illustrating the semiconductor device structure along a sectional line I-I in FIG. 1E, in accordance with some embodiments. FIG. 1E-2 is a cross-sectional view illustrating the semiconductor device structure along a sectional line II-II in FIG. 1E, in accordance with some embodiments.

As shown in FIGS. 1D, 1E, 1E-1, and 1E-2, an oxidation process is performed over the gate electrode 150 to oxidize the corner portions 151, the side portions 152, and the footing portions 154 of the gate electrode 150 to form oxide corner structures 161, an oxide film 162, and oxide footing structures 164, in accordance with some embodiments.

Since the corner portions 151 and the footing portions 154 tend to be oxidized, the oxidation rate of the corner portions 151 and the footing portions 154 is greater than that of the side portions 152, in accordance with some embodiments. Therefore, the sidewalls 150s of the gate electrode 150 become straight after the oxidation process, which improves the yield of a subsequent metal gate replacement process, in accordance with some embodiments.

The oxide corner structures 161, the oxide film 162, and the oxide footing structures 164 together form an oxide layer 160, in accordance with some embodiments. The oxide layer 160 is made of an oxide of the material of the gate electrode 150, in accordance with some embodiments. The average thickness of the oxide layer 160 ranges from about 0.5 nm to about 4 nm, in accordance with some embodiments.

The oxide film 162 has a recess 162a and a protruding portion 162b, in accordance with some embodiments. The protruding portion 162b fills the void V, in accordance with some embodiments. The recess 162a is substantially level with the void V of the gate electrode 150 (or the protruding portion 162b), in accordance with some embodiments.

Since the protruding portion 162b fills the void V, a spacer formed over the sidewalls 150s of the gate electrode 150 in a subsequent process is prevented from filling the void V, in accordance with some embodiments. If the spacer fills the void V, it is not conducive to deposit a gate dielectric layer in a trench of the spacer after removing the gate electrode 150, which reduces the breakdown voltage of the semiconductor device structure with the gate dielectric layer, in accordance with some embodiments. Therefore, the formation of the oxide layer 160 improves the yield and the performance of the semiconductor device structure with the oxide layer 160, in accordance with some embodiments.

The oxidation process includes a thermal annealing process, such as a radiant tube heating (RTH) process, a rapid thermal anneal (RTA) process, a laser spark anneal (LSA) process, or a micro-second anneal (uSSA) process, in accordance with some embodiments. The process temperature of the oxidation process ranges from about 500° C. to about 900° C., in accordance with some embodiments. The process time of the oxidation process ranges from about 15 sec to about 150 sec, in accordance with some embodiments.

Figure 1F:
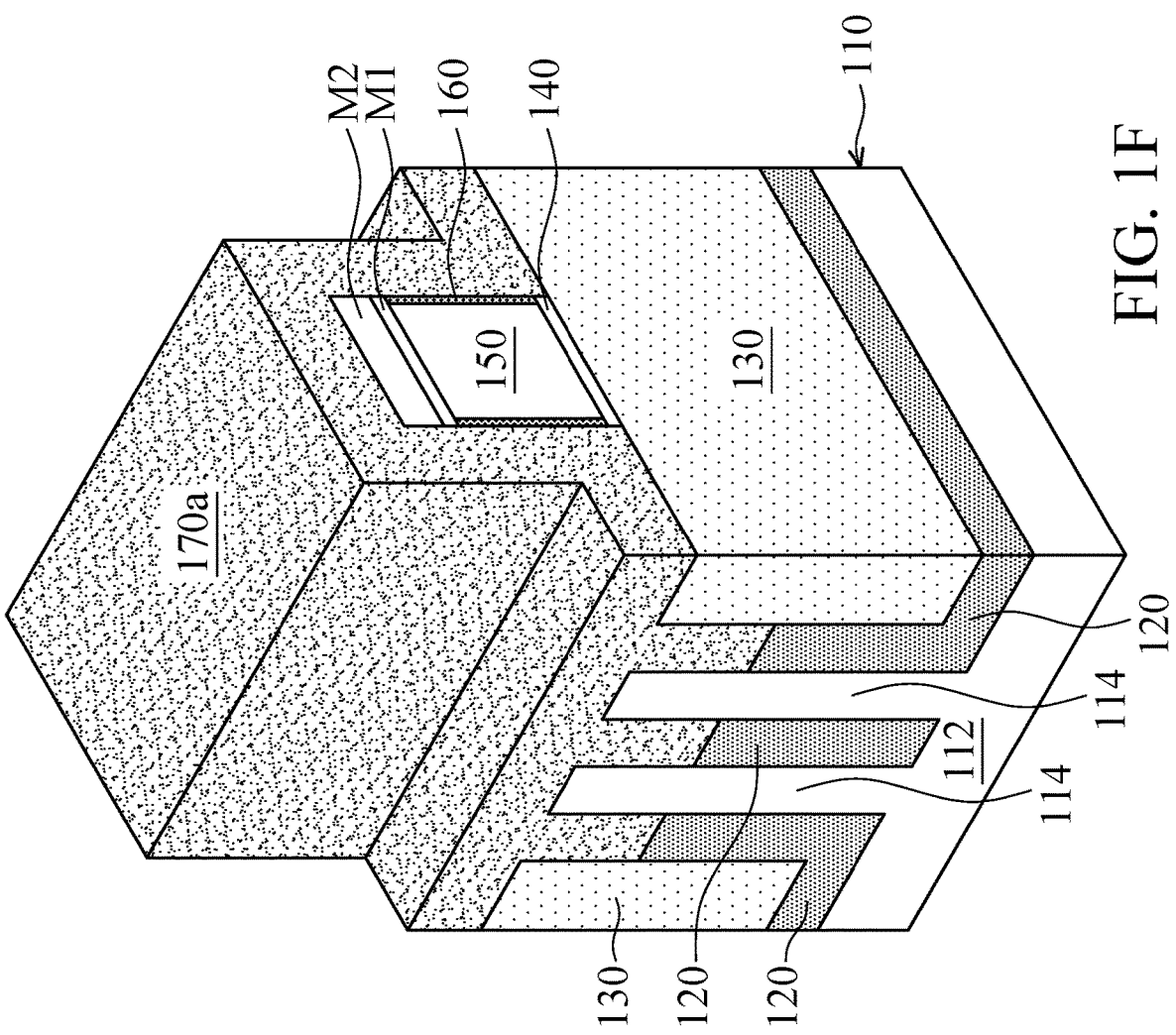

As shown in FIG. 1F, a spacer layer 170a is formed over the fins 114, the dielectric layer 120, the dielectric fins 130, the gate dielectric layer 140, the gate electrode 150, the oxide layer 160, and the mask layers M1 and M2, in accordance with some embodiments. The spacer layer 170a is a single-layered structure or a multi-layered structure, in accordance with some embodiments.

The spacer layer 170a and the oxide layer 160 are made of different materials, thereby improving an etching selectivity of the spacer layer 170a to the oxide layer 160, in accordance with some embodiments. The spacer layer 170a is made of an insulating material, such as oxides (e.g., silicon oxide), nitrides (e.g., silicon nitride), oxynitrides (e.g., silicon oxynitride or silicon oxycarbonitride (SiOCN)), a high-k material, a combination thereof, or another applicable insulating material.

The spacer layer 170a is formed using a deposition process, such as a chemical vapor deposition (CVD) process, an atomic layer deposition (ALD) process, or a physical vapor deposition (PVD) process, in accordance with some embodiments.

Figure 1G:
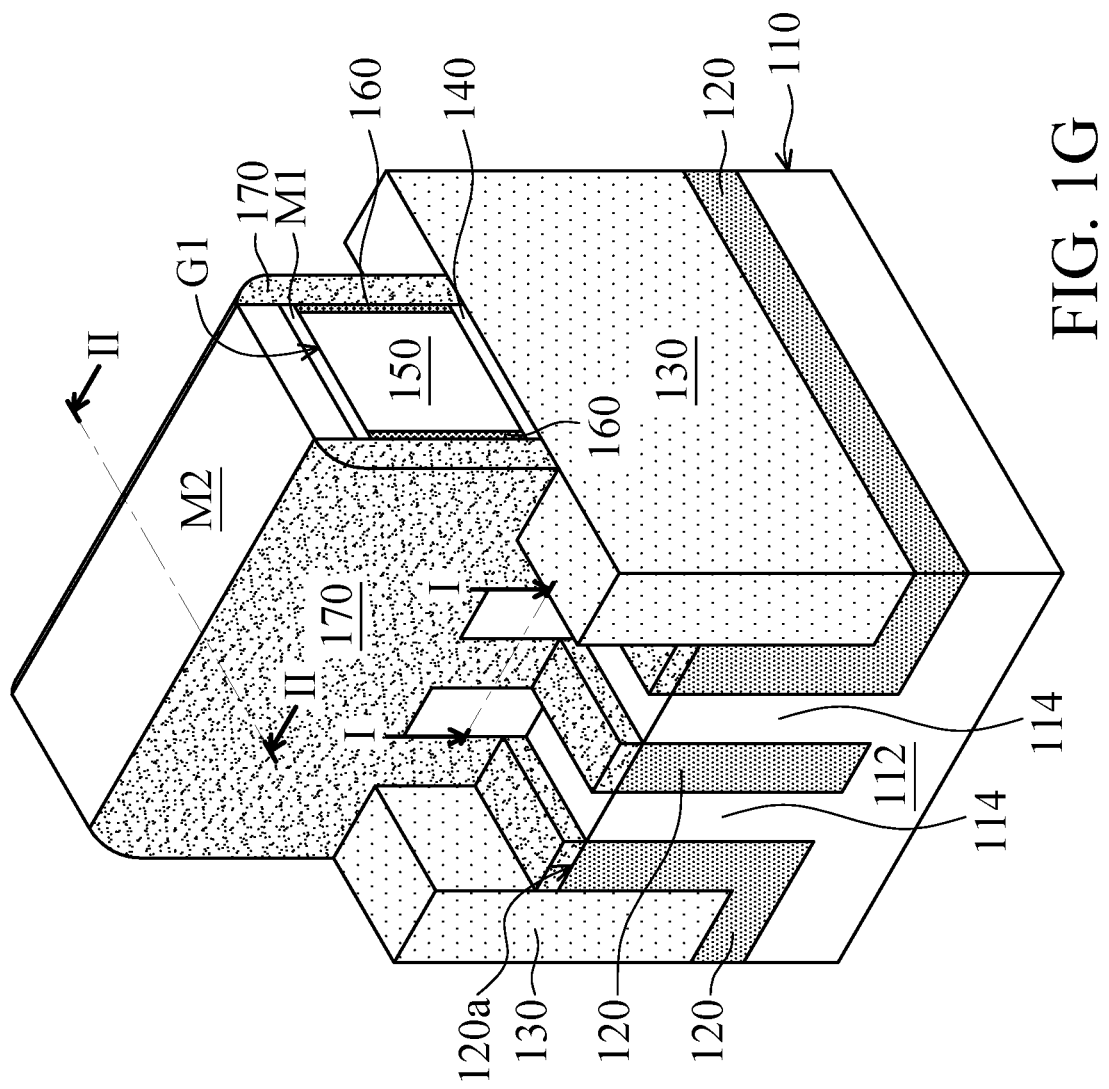
Figures 1, 1G, 2:
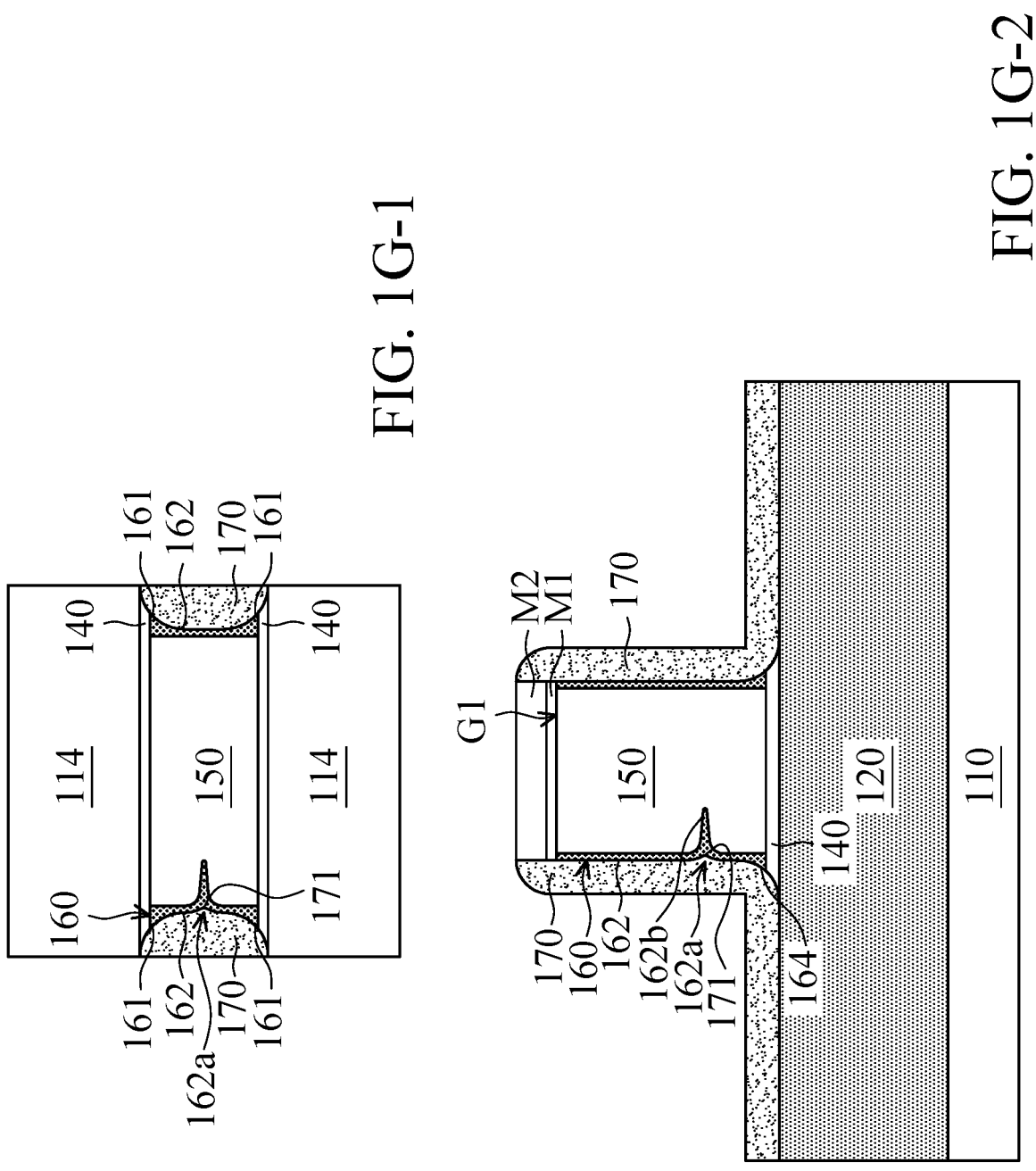

FIG. 1G-1 is a cross-sectional view illustrating the semiconductor device structure along a sectional line I-I in FIG. 1G, in accordance with some embodiments. FIG. 1G-2 is a cross-sectional view illustrating the semiconductor device structure along a sectional line II-II in FIG. 1G, in accordance with some embodiments.

As shown in FIGS. 1G, 1G-1, and 1G-2, portions of the spacer layer 170a and upper portions of the fins 114 are removed, in accordance with some embodiments. After the removal process, the spacer layer 170a remaining over opposite sidewalls of the gate stack G1, opposite sidewalls of the mask layers M1 and M2, and the top surface 120a of the dielectric layer 120 forms a spacer 170, in accordance with some embodiments.

The spacer 170 covers the oxide layer 160, in accordance with some embodiments. The spacer 170 has a protruding portion 171 filling the recess 162a of the oxide film 162 of the oxide layer 160, in accordance with some embodiments. The removal process includes an etching process, such as an anisotropic etching process, in accordance with some embodiments. The anisotropic etching process includes a dry etching process, in accordance with some embodiments.

In some other embodiments, the spacer 170 is a multi-layered structure. The spacer 170 includes layers, in accordance with some embodiments. The layers are made of different materials, in accordance with some embodiments.

Figure 1H:
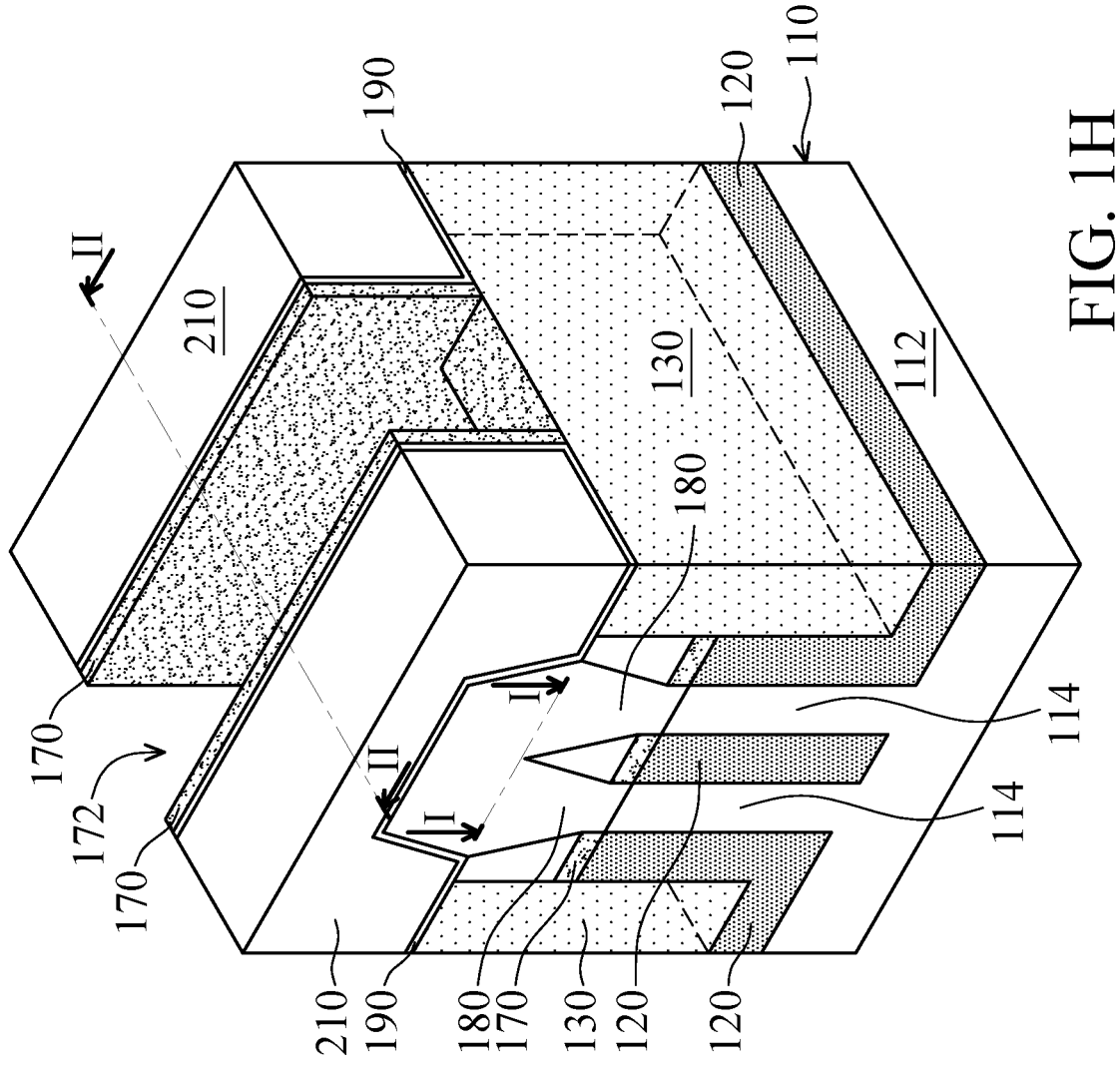
Figures 1, 1H, 2:
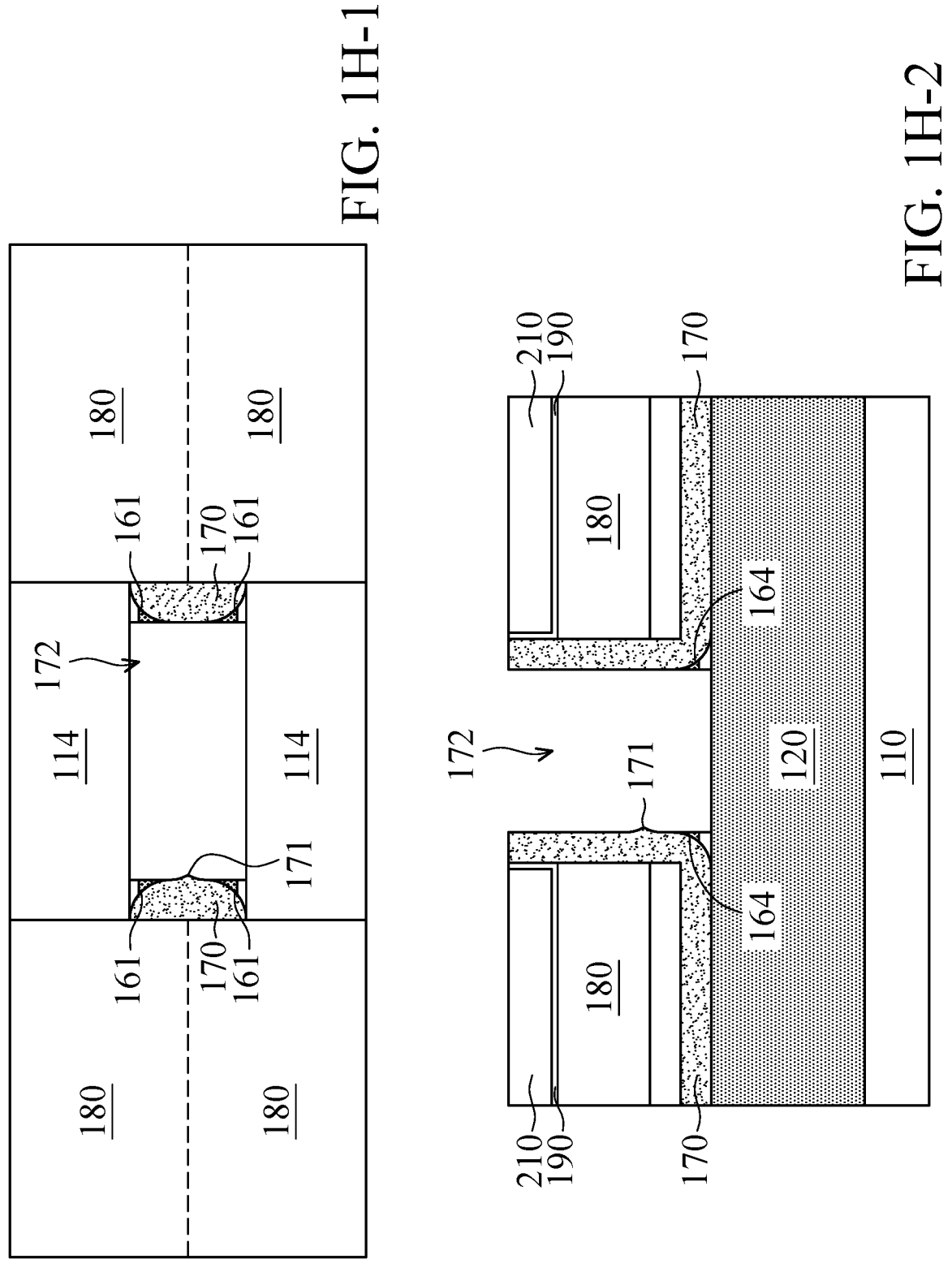

FIG. 1H-1 is a cross-sectional view illustrating the semiconductor device structure along a sectional line I-I in FIG. 1H, in accordance with some embodiments. FIG. 1H-2 is a cross-sectional view illustrating the semiconductor device structure along a sectional line II-II in FIG. 1H, in accordance with some embodiments.

As shown in FIGS. 1H, 1H-1, and 1H-2, source/drain structures 180 are respectively formed over the fins 114, in accordance with some embodiments. The two adjacent source/drain structures 180 are merged with each other, in accordance with some embodiments.

In some embodiments, the source/drain structures 180 are made of a semiconductor material (e.g., silicon) with N-type dopants, such as the Group VA element, in accordance with some embodiments. The Group VA element includes phosphor (P), antimony (Sb), or another suitable Group VA material.

In some embodiments, the source/drain structures 180 are made of a semiconductor material (e.g., silicon germanium) with P-type dopants, such as the Group IIIA element, in accordance with some embodiments. The Group IIIA element includes boron or another suitable material. The source/drain structures 180 are formed using an epitaxial process, in accordance with some embodiments.

As shown in FIGS. 1H and 1H-2, an etch stop layer 190 is conformally formed over the source/drain structures 180, the dielectric fins 130, the spacer 170, and the mask layer M2 (as shown in FIG. 1G), in accordance with some embodiments. The etch stop layer 190 is made of an insulating material, such as a nitrogen-containing material (e.g., silicon nitride), in accordance with some embodiments.

The etch stop layer 190 is formed using a deposition process, such as a chemical vapor deposition (CVD) process, an atomic layer deposition (ALD) process, or a physical vapor deposition (PVD) process, in accordance with some embodiments.

As shown in FIGS. 1H and 1H-2, a dielectric layer 210 is formed over the etch stop layer 190, in accordance with some embodiments. The dielectric layer 210 is made of any suitable insulating material, such as silicon oxide, silicon oxynitride, borosilicate glass (BSG), phosphoric silicate glass (PSG), borophosphosilicate glass (BPSG), fluorinated silicate glass (FSG), a low-k material, a porous dielectric material, or a combination thereof. The dielectric layer 210 is formed by any suitable process, such as a CVD process, a spin-on process, a sputtering process, or a combination thereof, in accordance with some embodiments.

Afterwards, upper portions of the dielectric layer 210 and the etch stop layer 190 and the mask layers M1 and M2 are removed, in accordance with some embodiments. Thereafter, a gate replacement process is performed, in accordance with some embodiments.

As shown in FIGS. 1H, 1H-1, and 1H-2, the gate electrode 150 is removed, in accordance with some embodiments. After the removal process, a trench 172 is formed in the spacer 170, in accordance with some embodiments. In some embodiments, the removal process includes an etching process. The etching process includes a dry etching process or a wet etching process, in accordance with some embodiments.

As shown in FIGS. 1G-2, 1H, 1H-1, and 1H-2, the oxide film 162 and the gate dielectric layer 140 under the trench 172 are removed through the trench 172, in accordance with some embodiments. The trench 172 exposes the dielectric fins 130, the fins 114, and the dielectric layer 120, in accordance with some embodiments.

Figure 1I:
Figures 1, 1I, 2:
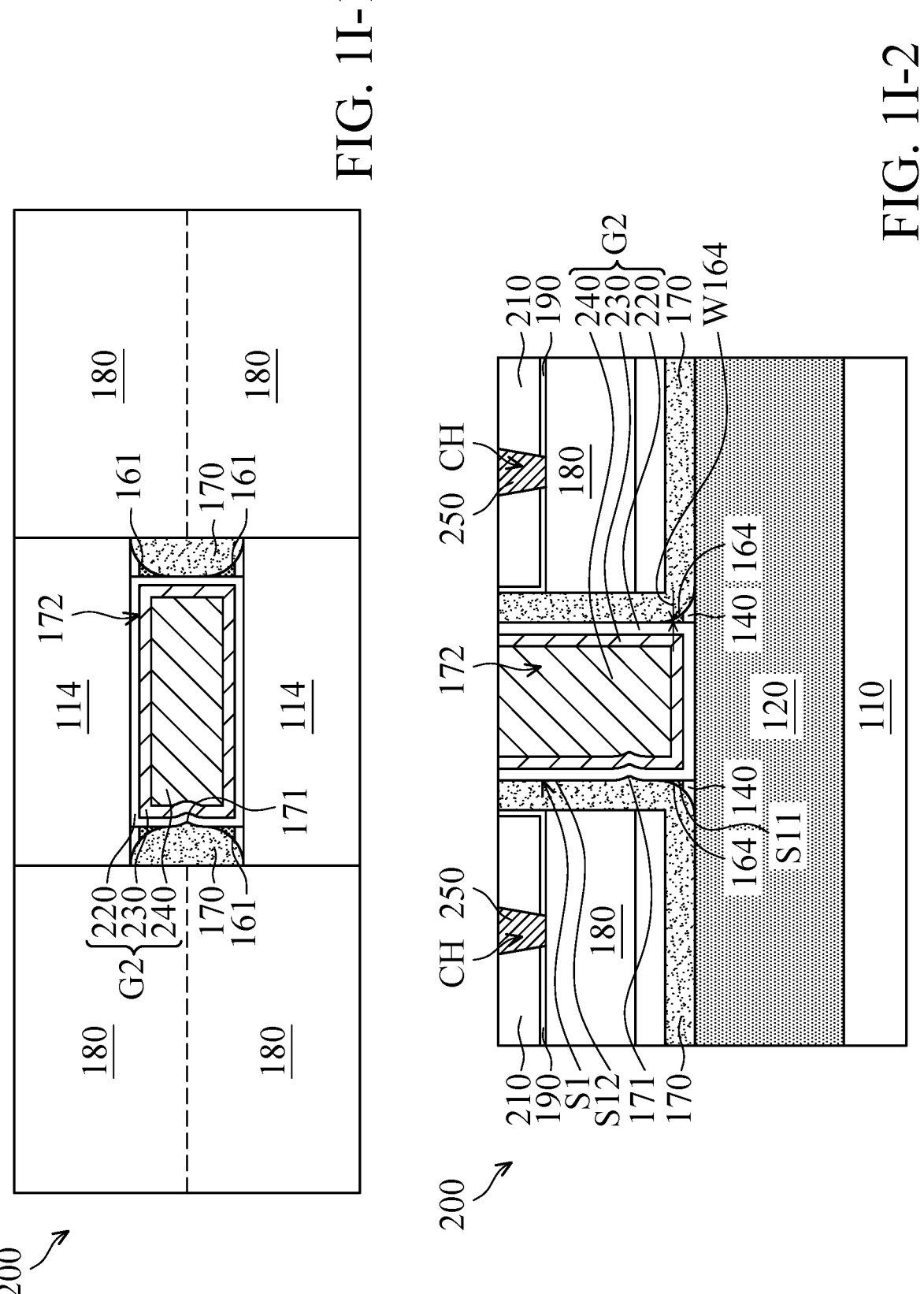

FIG. 1I-1 is a cross-sectional view illustrating the semiconductor device structure along a sectional line I-I in FIG. 1I, in accordance with some embodiments. FIG. 1I-2 is a cross-sectional view illustrating the semiconductor device structure along a sectional line II-II in FIG. 1I, in accordance with some embodiments. As shown in FIGS. 1I, 1I-1, and 1I-2, a gate stack G2 is formed in the trench 172 of the spacer 170, in accordance with some embodiments.

FIG. 1I-3 is a cross-sectional view illustrating the semiconductor device structure along a sectional line III-III in FIG. 1I, in accordance with some embodiments. FIG. 1I-4 is a cross-sectional view illustrating the semiconductor device structure along a sectional line IV-IV in FIG. 1I, in accordance with some embodiments.

As shown in FIGS. 1I, 1I-3, and 1I-4, the gate stack G2 includes a gate dielectric layer 220, a work function metal layer 230, and a gate electrode 240, in accordance with some embodiments. The gate dielectric layer 220 is conformally formed in the trench 172, in accordance with some embodiments.

The gate dielectric layer 220 is made of a dielectric material, such as a high dielectric constant (high-k) material, in accordance with some embodiments. The high-k material is made of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof, in accordance with some embodiments.

In some embodiments, the high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or combinations thereof.

The work function metal layer 230 is conformally formed over the gate dielectric layer 220, in accordance with some embodiments. The work function metal layer 230 provides a desired work function for transistors to enhance device performance including improved threshold voltage.

In the embodiments of forming an NMOS transistor, the work function metal layer 230 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

On the other hand, in the embodiments of forming a PMOS transistor, the work function metal layer 230 can be a p-type metal capable of providing a work function value suitable for the device, such as equal to or greater than about 4.8 eV. The p-type metal may be made of metal, metal carbide, metal nitride, other suitable materials, or a combination thereof. For example, the p-type metal is made of titanium, titanium nitride, other suitable materials, or combinations thereof. The work function metal layer 230 may also be made of hafnium, zirconium, titanium, tantalum, aluminum, metal carbides (e.g., hafnium carbide or zirconium carbide), aluminides, ruthenium or a combination thereof.

The gate electrode 240 is formed over the work function metal layer 230, in accordance with some embodiments. The gate electrode 240 is also called a metal gate electrode, in accordance with some embodiments. The gate electrode 240 is made of a suitable metal material, such as aluminum, tungsten, gold, platinum, cobalt, other suitable metal, an alloy thereof, or a combination thereof, in accordance with some embodiments.

As shown in FIG. 1I-1, the oxide corner structure 161 is between the spacer 170 and the gate dielectric layer 220, in accordance with some embodiments. As shown in FIG. 1I-2, the protruding portion 171 of the spacer 170 extends into the gate stack G2, in accordance with some embodiments.

The protruding portion 171 extends into the gate dielectric layer 220, in accordance with some embodiments. The gate dielectric layer 220 partially extends into the work function metal layer 230, in accordance with some embodiments. The work function metal layer 230 partially extends into the gate electrode 240, in accordance with some embodiments.

The oxide footing structure 164 is over a lower portion S11 of a sidewall S1 of the gate stack G2, in accordance with some embodiments. The oxide footing structure 164 has a width W164, in accordance with some embodiments. The width W164 increases toward the substrate 110 or the dielectric layer 120, in accordance with some embodiments. The dielectric constant of the oxide layer 160 is less than that of the spacer 170 or the gate dielectric layer 220, in accordance with some embodiments.

Since the oxide corner structures 161 and the oxide footing structures 164 are remained, the corner space is occupied by the oxide corner structures 161 and the oxide footing structures 164, which prevents the gate dielectric layer 220 from filling the corner space, in accordance with some embodiments. Therefore, the thickness of the gate dielectric layer 220 close to the corner space is reduced, which reduces the capacitance between the gate stack G2 and the source/drain structures 180, in accordance with some embodiments. As a result, the performance of the semiconductor device structure with the oxide corner structures 161 and the oxide footing structures 164 is improved, in accordance with some embodiments.

The spacer 170 covers the sidewall S1 of the gate stack G2 and the oxide footing structure 164, in accordance with some embodiments. The spacer 170 is in direct contact with the oxide footing structure 164, in accordance with some embodiments. The spacer 170 is in direct contact with an upper portion S12 of the sidewall S1 of the gate stack G2, in accordance with some embodiments.

Thereafter, as shown in FIGS. 1I and 1I-2, portions of the dielectric layer 210 and the etch stop layer 190 are removed to form contact holes CH in the dielectric layer 210 and the etch stop layer 190, in accordance with some embodiments. The contact holes CH pass though the dielectric layer 210 and the etch stop layer 190, in accordance with some embodiments. The contact holes CH partially expose the source/drain structures 180 thereunder, in accordance with some embodiments.

As shown in FIGS. 1I and 1I-2, contact structures 250 are formed in the contact holes CH, in accordance with some embodiments. The contact structures 250 pass through the dielectric layer 210 and the etch stop layer 190 to connect to the source/drain structures 180 thereunder, in accordance with some embodiments.

The formation of the contact structures 250 includes depositing a conductive material layer (not shown) over the dielectric layer 210 and in the contact holes CH; and performing a chemical mechanical polishing (CMP) process over the conductive material layer to remove the conductive material layer outside of the contact holes CH, in accordance with some embodiments.

The contact structures 250 are made of tungsten (W) or another suitable conductive material, in accordance with some embodiments. In this step, a semiconductor device structure 200 is substantially formed, in accordance with some embodiments. The semiconductor device structure 200 includes a memory device such as a random access memory (RAM) device, in accordance with some embodiments.

The methods perform an oxidation process (i.e. the step of FIG. 1E) to oxidize the gate electrode 150 so as to form the oxide layer 160, in accordance with some embodiments. The oxide layer 160 is able to fill the void V in the gate electrode 150, which prevents the spacer 170 from filling into the void V, in accordance with some embodiments. The oxide layer 160 is able to be removed in a subsequent removal process of the gate dielectric layer 140, in accordance with some embodiments. Therefore, the formation of the oxide layer 160 improves the yield of the metal gate replacement process (i.e. the steps of FIGS. 1H-1I). As a result, the yield and the performance of the semiconductor device structure 200 are also improved, in accordance with some embodiments.

Figure 2A:
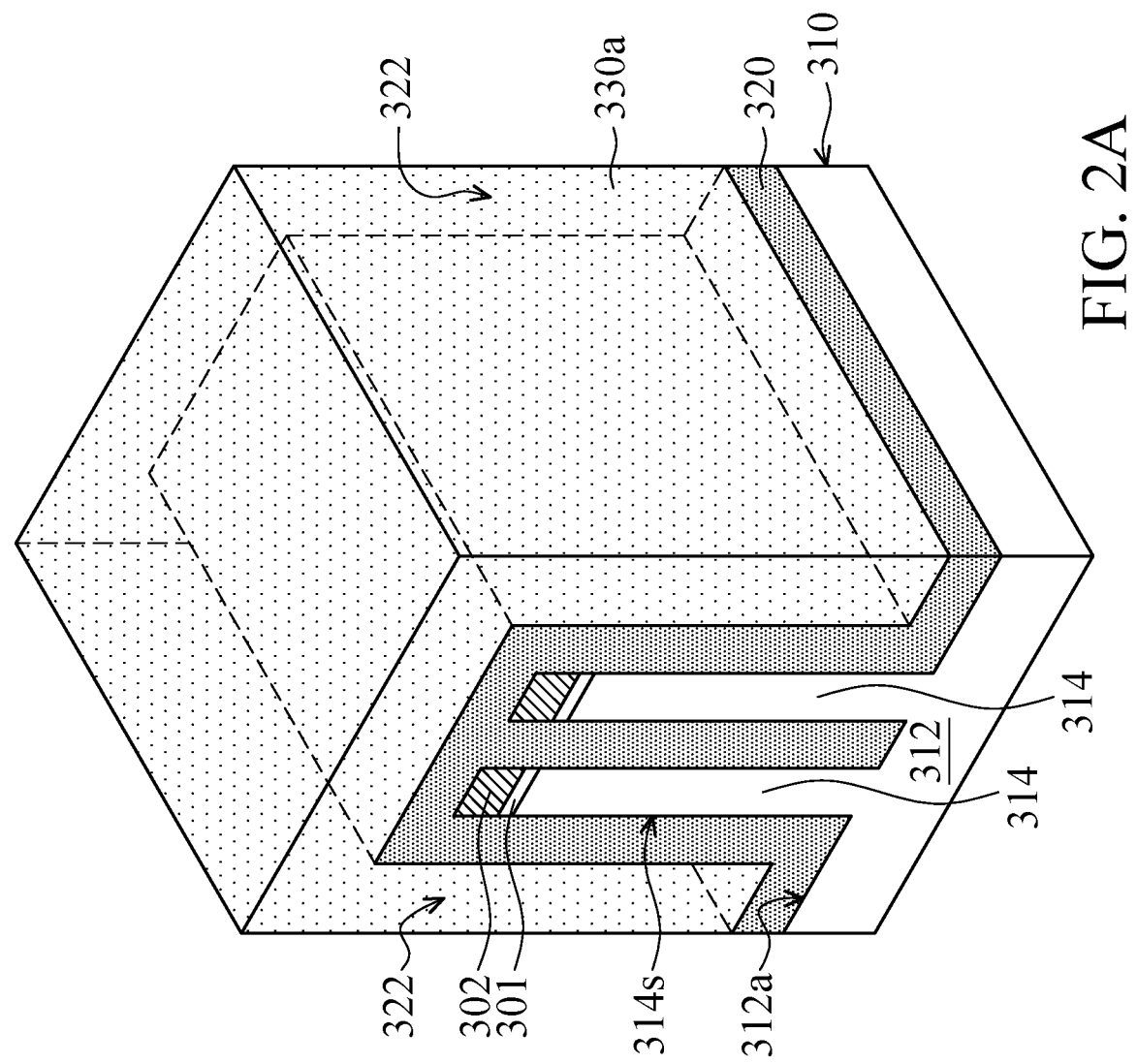
FIGS. 2A-2I are perspective views of various stages of a process for forming a semiconductor device structure, in accordance with some embodiments.

FIGS. 2A-2I are perspective views of various stages of a process for forming a semiconductor device structure, in accordance with some embodiments. As shown in FIG. 2A, a substrate 310 is provided, in accordance with some embodiments. The substrate 310 includes, for example, a semiconductor substrate. The substrate 310 includes, for example, a semiconductor wafer (such as a silicon wafer) or a portion of a semiconductor wafer.

In some embodiments, the substrate 310 is made of an elementary semiconductor material including silicon or germanium in a single crystal structure, a polycrystal structure, or an amorphous structure. In some other embodiments, the substrate 310 is made of a compound semiconductor, such as silicon carbide, gallium arsenide, gallium phosphide, indium phosphide, indium arsenide, an alloy semiconductor, such as SiGe or GaAsP, or a combination thereof. The substrate 310 may also include multi-layer semiconductors, semiconductor on insulator (SOI) (such as silicon on insulator or germanium on insulator), or a combination thereof.

In some embodiments, the substrate 310 is a device wafer that includes various device elements. In some embodiments, the various device elements are formed in and/or over the substrate 310. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 310. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 310. The isolation features are used to surround active regions and electrically isolate various device elements formed in and/or over the substrate 310 in the active regions. In some embodiments, the isolation features include shallow trench isolation (STI) features, local oxidation of silicon (LOCOS) features, other suitable isolation features, or a combination thereof.

Thereafter, as shown in FIG. 2A, mask layers 301 and 302 are successively formed over the substrate 310, in accordance with some embodiments. In some embodiments, the mask layer 301 serves a buffer layer or an adhesion layer that is formed between the underlying substrate 310 and the overlying mask layer 302. The mask layer 301 may also be used as an etch stop layer when the mask layer 302 is removed or etched.

In some embodiments, the mask layer 301 is made of silicon oxide. In some embodiments, the mask layer 301 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, or another applicable process.

The mask layers 301 and 302 are made of different materials, in accordance with some embodiments. In some embodiments, the mask layer 302 is made of silicon nitride, silicon oxynitride, silicon oxide, or another applicable material. In some embodiments, the mask layer 302 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, or another applicable process.

After the formation of the mask layers 301 and 302, the mask layer 301 and the overlying mask layer 302 are patterned by a photolithography process and an etching process, so as to expose portions of the substrate 310.

For example, the photolithography process may include photoresist coating (e.g., spin-on coating), soft baking, mask aligning, exposure, post-exposure baking, developing the photoresist, rinsing and drying (e.g., hard baking). Moreover, the etching process may be a dry etching process, such as a reactive ion etching (RIE) process, an neutral beam etching (NBE) process, the like, or a combination thereof.

Afterwards, as shown in FIG. 2A, an etching process is performed on the substrate 310 by using the (patterned) mask layers 301 and 302 as an etch mask, in accordance with some embodiments. After the etching process, the substrate 310 has a base 312 and fins 314, in accordance with some embodiments. The fins 314 are over the base 312, in accordance with some embodiments. The fins 314 are spaced apart from each other, in accordance with some embodiments. In some embodiments, the etching process includes a dry etching process.

The fin 314 has sidewalls 314s, in accordance with some embodiments. The base 312 has a top surface 312a, in accordance with some embodiments. In some embodiments, the sidewalls 314s are substantially perpendicular to the top surface 312a. In some other embodiments (not shown), the sidewalls 314s are sloped sidewalls with respect to the top surface 312a.

As shown in FIG. 2A, a dielectric layer 320 is deposited over the base 312, the fins 314, and the mask layers 301 and 302, in accordance with some embodiments. The dielectric layer 320 conformally covers the base 312, the fins 314, and the mask layers 301 and 302, in accordance with some embodiments.

In some embodiments, the dielectric layer 320 is made of oxide (such as silicon oxide), fluorosilicate glass (FSG), a low-k dielectric material, and/or another suitable dielectric material. The dielectric layer 320 may be deposited by an atomic layer deposition (ALD) process, a chemical vapor deposition (CVD) process, or another applicable process.

As shown in FIG. 2A, a dielectric layer 330a is formed over the dielectric layer 320, in accordance with some embodiments. The trenches 322 of the dielectric layer 320 are filled with the dielectric layer 330a, in accordance with some embodiments.

The dielectric layer 330a is made of oxide (e.g., silicon oxide), nitride (e.g., silicon nitride, silicon carbon nitride, silicon oxycarbon nitride, titanium nitride, or tantalum nitride), carbide (e.g., silicon oxycarbide), metal oxide (e.g., oxides of Li, Be, Mg, Ca, Sr, Sc, Y, Zr, Al, La, Ce, Pr, Nd, Sm, Eu, Gd, Tb, Dy, Ho, Hf, Er, Tm, Yb, Lu, and/or mixtures thereof), or another suitable insulating material, in accordance with some embodiments.

In some embodiments, the dielectric layers 320 and 330a are made of different materials with different etching rates under an etchant. The dielectric layer 330a is formed using a deposition process, such as a chemical vapor deposition (CVD) process, an atomic layer deposition (ALD) process, or a physical vapor deposition (PVD) process, in accordance with some embodiments.

Figure 2B:
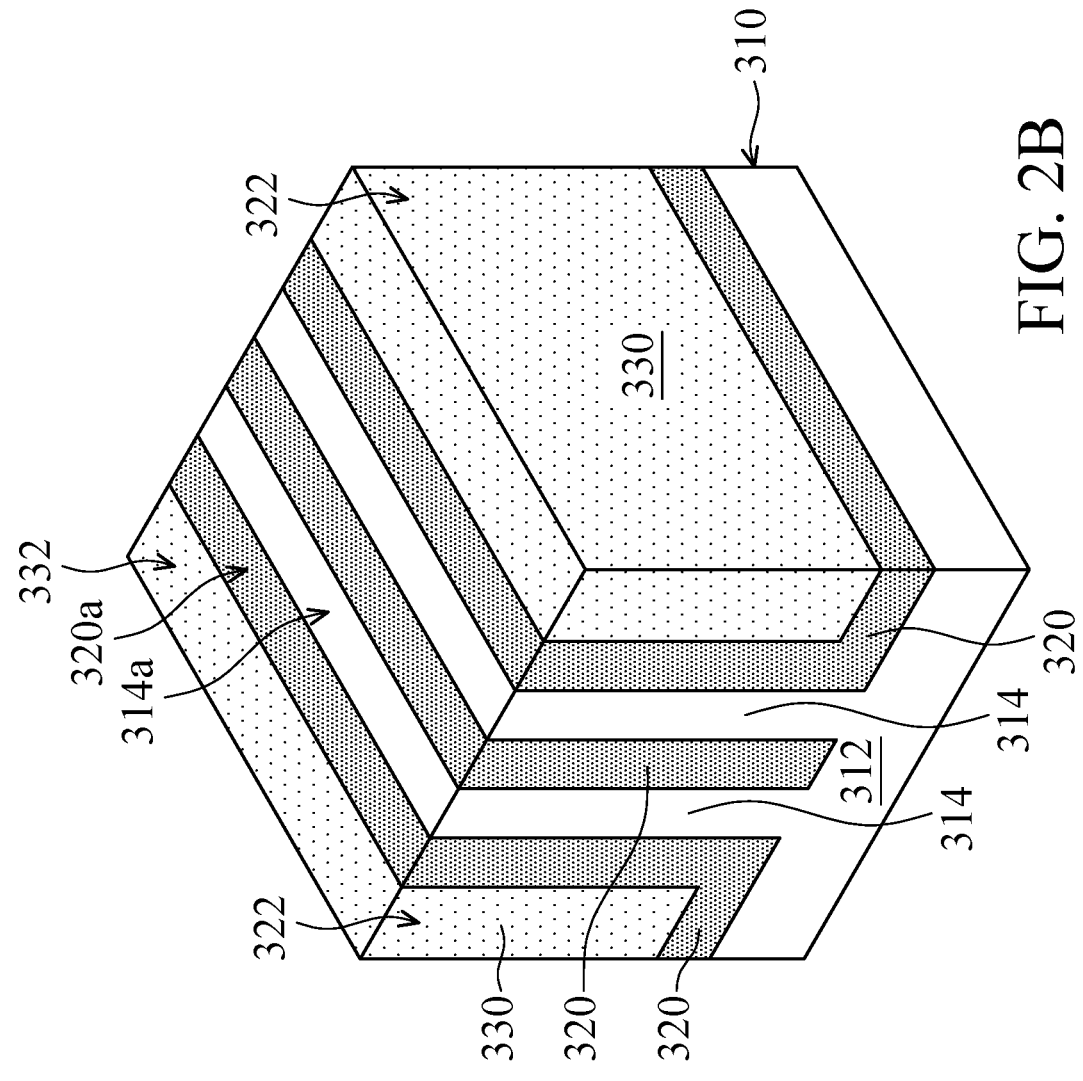

As shown in FIGS. 2A and 2B, top portions of the dielectric layers 320 and 330a and the mask layers 301 and 302 are removed, in accordance with some embodiments. In some embodiments, top portions of the fins 314 are also removed.

After the removal process, the dielectric layer 330a remaining in the trenches 322 of the dielectric layer 320 forms dielectric fins 330, in accordance with some embodiments. The dielectric fins 330 are separated from each other by the fins 314 and the dielectric layer 320, in accordance with some embodiments.

In some embodiments, top surfaces 332, 314a, and 320a of the dielectric fins 330, the fins 314, and the dielectric layer 320 are substantially coplanar with (or aligned with) each other, in accordance with some embodiments. The removal process includes performing a thinning process on a top surface of the dielectric layer 330a, in accordance with some embodiments. The thinning process includes a chemical mechanical polishing (CMP) process, in accordance with some embodiments.

Figure 2C:
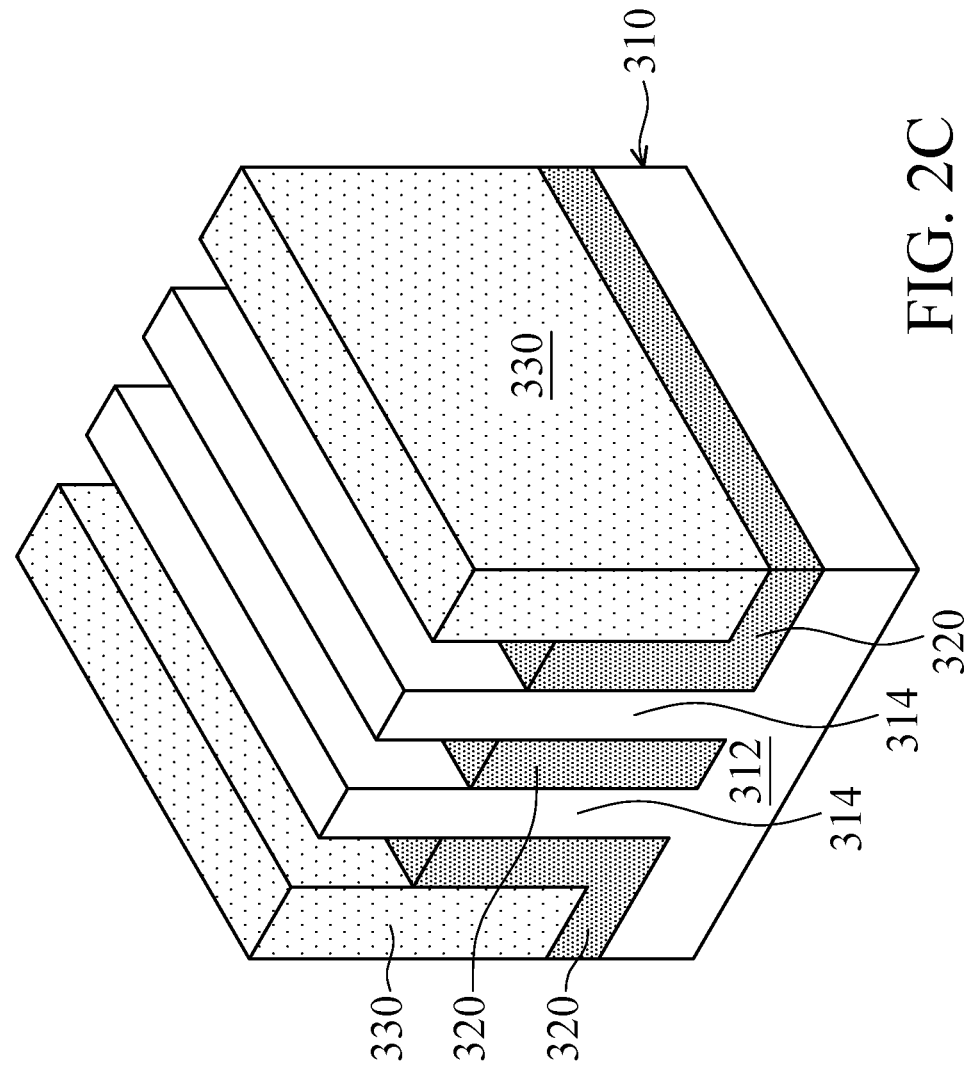

As shown in FIG. 2C, upper portions of the dielectric layer 320 are removed, in accordance with some embodiments. The removal process includes an etching process, in accordance with some embodiments. The etching process includes a dry etching process or a wet etching process, in accordance with some embodiments.

Figure 2D:
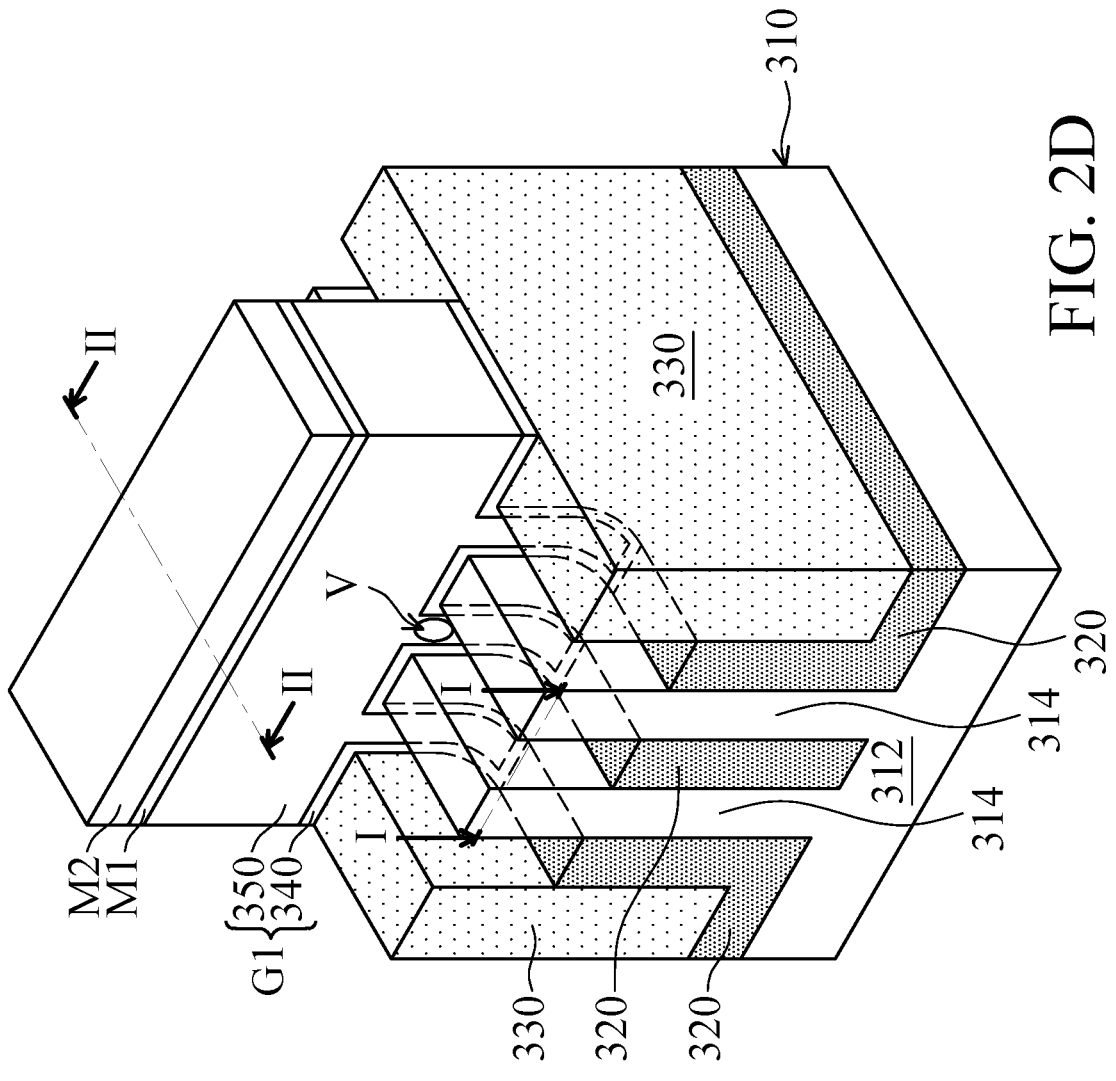
Figures 1, 2, 2D:
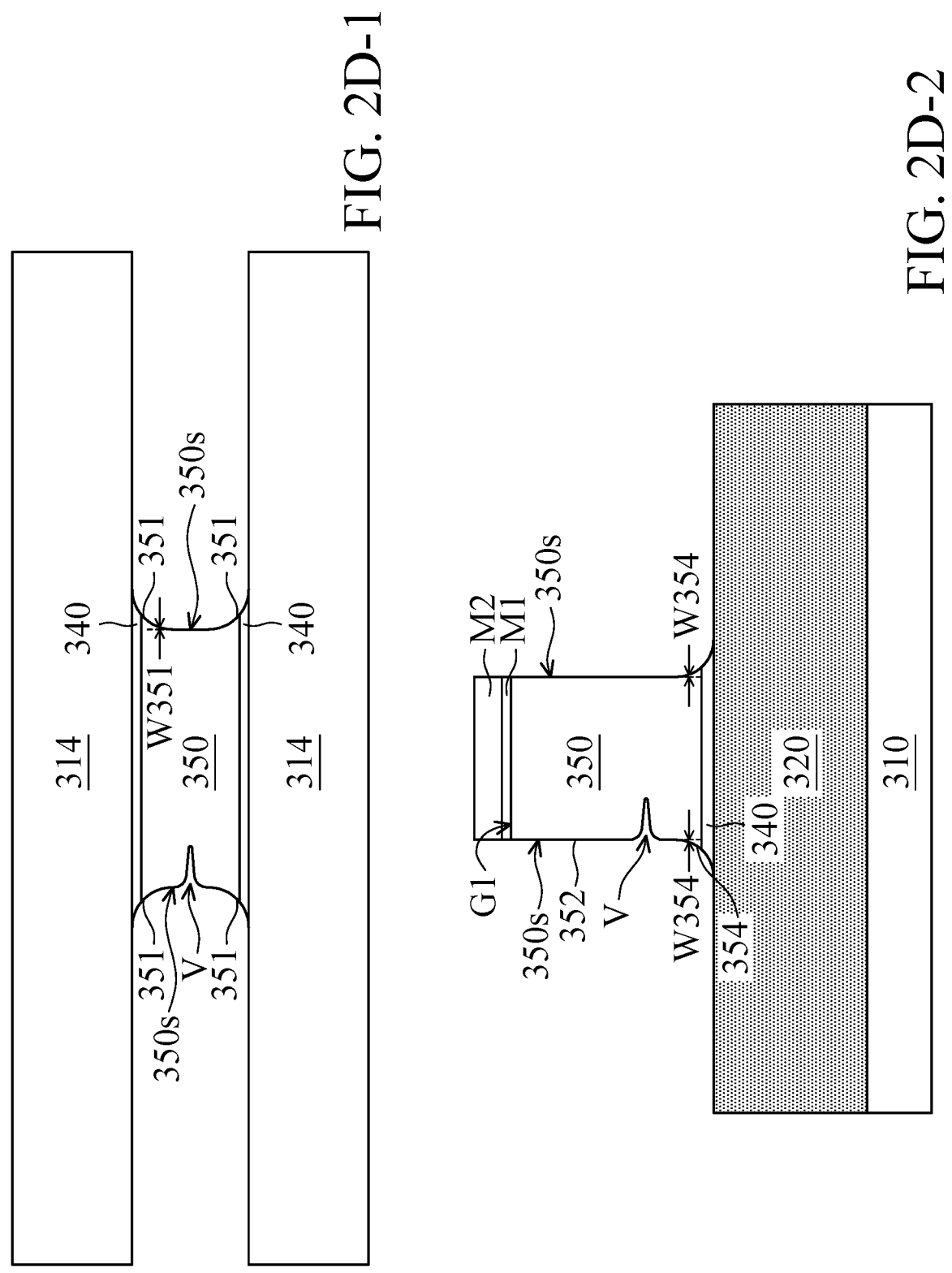

As shown in FIG. 2D, a gate dielectric layer 340, a gate electrode 350, and mask layers M1 and M2 are formed over the fins 314, the dielectric layer 320, and the dielectric fins 330, in accordance with some embodiments. The gate dielectric layer 340 and the gate electrode 350 together form a gate stack G1, in accordance with some embodiments.

The gate dielectric layer 340 conformally and partially covers the fins 314, the dielectric layer 320, and the dielectric fins 330, in accordance with some embodiments. The gate electrode 350 is over the gate dielectric layer 340, in accordance with some embodiments.

FIG. 2D-1 is a cross-sectional view illustrating the semiconductor device structure along a sectional line I-I in FIG. 2D, in accordance with some embodiments. FIG. 2D-2 is a cross-sectional view illustrating the semiconductor device structure along a sectional line II-II in FIG. 2D, in accordance with some embodiments.

As shown in FIGS. 2D, 2D-1, and 2D-2, the gate electrode 350 has corner portions 351, side portions 352, and footing portions 354, in accordance with some embodiments. The corner portions 351 are close to the fins 314, in accordance with some embodiments. In some embodiments, a width W351 of the corner portion 351 increases toward the closest fin 314. As shown in FIG. 2D-1, the gate electrode 350 has a bamboo-like shape, in accordance with some embodiments.

The gate electrode 350 has a void V, in accordance with some embodiments. The void V is in the side portion 352, in accordance with some embodiments. The footing portions 354 are close to the gate dielectric layer 340, the dielectric layer 320, and the substrate 310, in accordance with some embodiments. In some embodiments, a width W354 of the footing portion 354 increases toward the substrate 310.

The gate dielectric layer 340 is made of an insulating material, such as oxide (e.g., silicon oxide), in accordance with some embodiments. In some other embodiments, the gate dielectric layer 340 is made of a dielectric material, such as a high dielectric constant (high-k) material, in accordance with some embodiments. The high-k material is made of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof, in accordance with some embodiments.

In some embodiments, the high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or combinations thereof. The gate electrode 350 is made of a semiconductor material (e.g. polysilicon), in accordance with some embodiments.

The formation of the gate dielectric layer 340 and the gate electrode 350 includes: depositing a gate dielectric material layer (not shown) over the fins 314, the dielectric layer 320, and the dielectric fins 330; depositing a gate electrode material layer (not shown) over the gate dielectric material layer; sequentially forming the mask layers M1 and M2 over the gate electrode material layer, wherein the mask layers M1 and M2 expose portions of the gate electrode material layer; and removing the exposed portions of the gate electrode material layer and the gate dielectric material layer thereunder.

In some embodiments, the mask layer M1 serves a buffer layer or an adhesion layer that is formed between the underlying gate electrode 350 and the overlying mask layer M2. The mask layer M1 may also be used as an etch stop layer when the mask layer M2 is removed or etched.

In some embodiments, the mask layer M1 is made of silicon oxide. The mask layers M1 and M2 are made of different materials, in accordance with some embodiments. In some embodiments, the mask layer M2 is made of silicon nitride, silicon oxynitride, silicon oxide, or another applicable material.

Figure 2E:
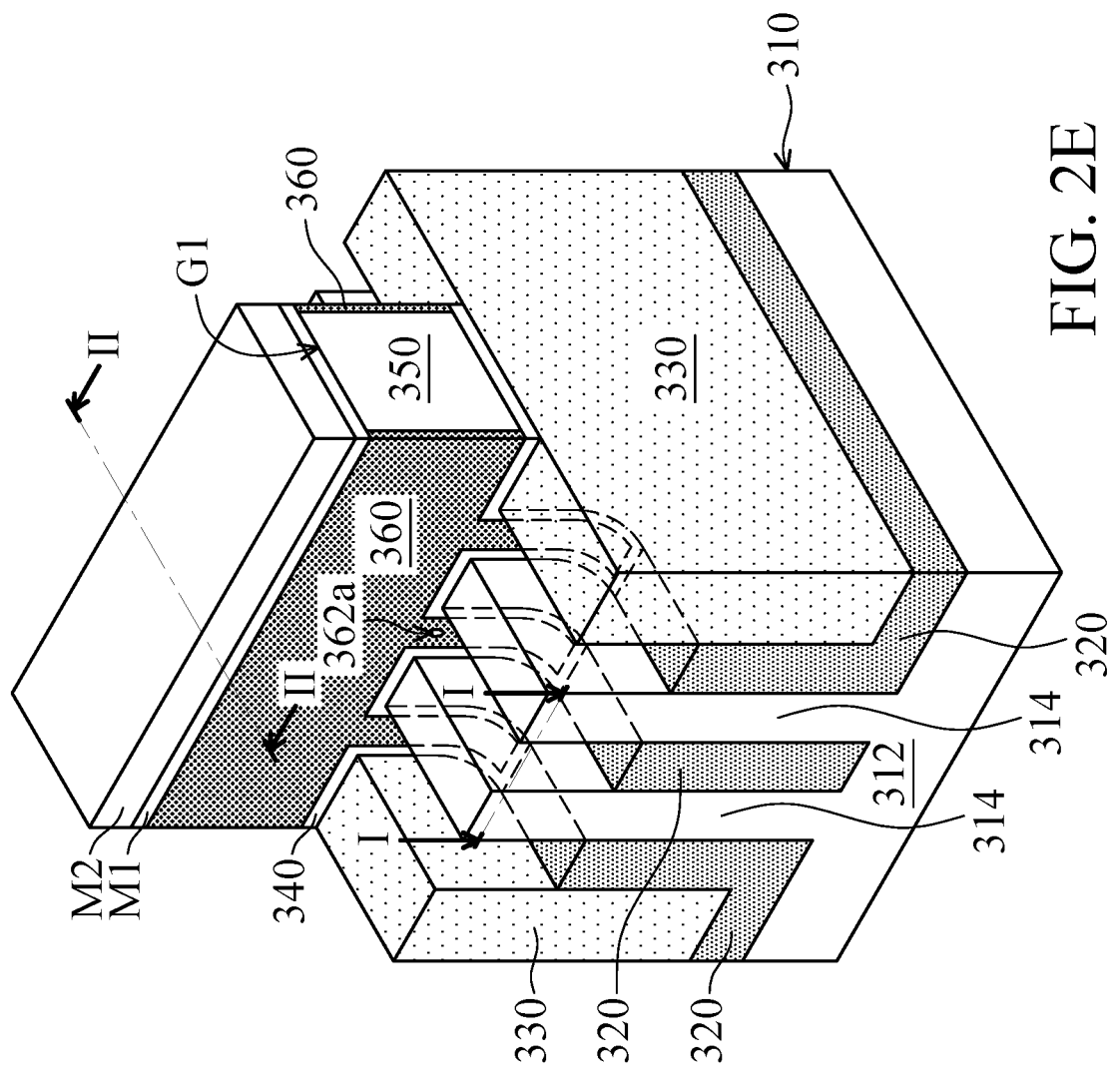
Figures 1, 2, 2E:
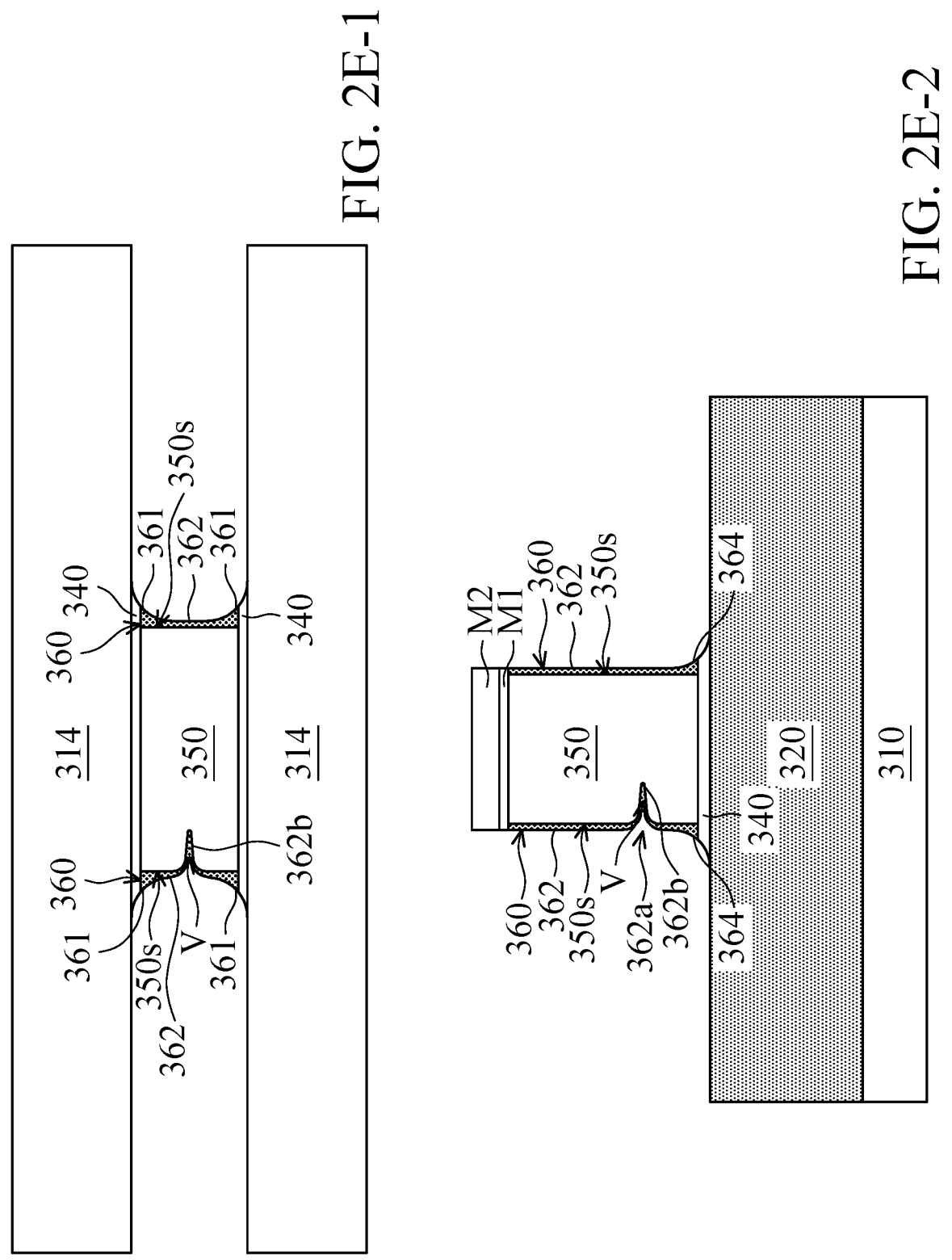

FIG. 2E-1 is a cross-sectional view illustrating the semiconductor device structure along a sectional line I-I in FIG. 2E, in accordance with some embodiments. FIG. 2E-2 is a cross-sectional view illustrating the semiconductor device structure along a sectional line II-II in FIG. 2E, in accordance with some embodiments.

As shown in FIGS. 2E, 2E-1, and 2E-2, an oxidation process is performed over the gate electrode 350 to oxidize the corner portions 351, the side portions 352, and the footing portions 354 of the gate electrode 350 to form oxide corner structures 361, an oxide film 362, and oxide footing structures 364, in accordance with some embodiments.

Since the corner portions 351 and the footing portions 354 tend to be oxidized, the oxidation rate of the corner portions 351 and the footing portions 354 is greater than that of the side portions 352, in accordance with some embodiments. Therefore, the sidewalls 350s of the gate electrode 350 become straight after the oxidation process, which improves the yield of a subsequent metal gate replacement process, in accordance with some embodiments.

The oxide corner structures 361, the oxide film 362, and the oxide footing structures 364 together form an oxide layer 360, in accordance with some embodiments. The oxide film 362 has a recess 362a and a protruding portion 362b, in accordance with some embodiments. The protruding portion 362b fills the void V, in accordance with some embodiments. The recess 362a is substantially level with the void V (or the protruding portion 362b), in accordance with some embodiments.

The oxidation process includes a thermal annealing process, such as a radiant tube heating (RTH) process, a rapid thermal anneal (RTA) process, a laser spark anneal (LSA) process, or a micro-second anneal (uSSA) process, in accordance with some embodiments. The process temperature of the oxidation process ranges from about 500° C. to about 900° C., in accordance with some embodiments. The process time of the oxidation process ranges from about 15 sec to about 150 sec, in accordance with some embodiments.

Figure 2F:
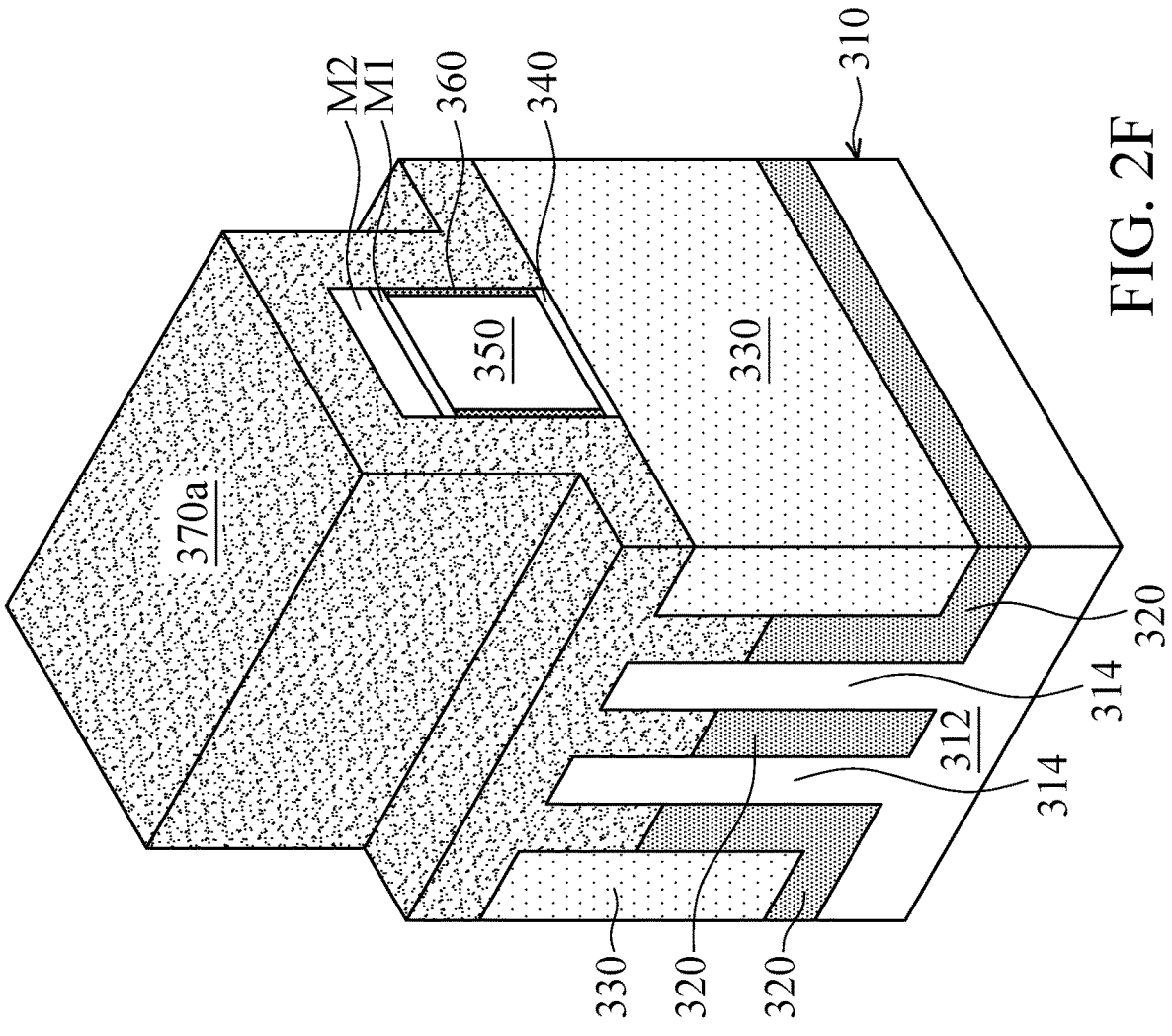

As shown in FIG. 2F, a spacer layer 370a is formed over the fins 314, the dielectric layer 320, the dielectric fins 330, the gate dielectric layer 340, the gate electrode 350, the oxide layer 360, and the mask layers M1 and M2, in accordance with some embodiments. The spacer layer 370a is a single-layered structure or a multi-layered structure, in accordance with some embodiments.

The spacer layer 370a is made of an insulating material, such as oxides (e.g., silicon oxide), nitrides (e.g., silicon nitride), oxynitrides (e.g., silicon oxynitride or silicon oxycarbonitride (SiOCN)), a high-k material, a combination thereof, or another applicable insulating material.

The spacer layer 370a is formed using a deposition process, such as a chemical vapor deposition (CVD) process, an atomic layer deposition (ALD) process, or a physical vapor deposition (PVD) process, in accordance with some embodiments.

Figure 2G:
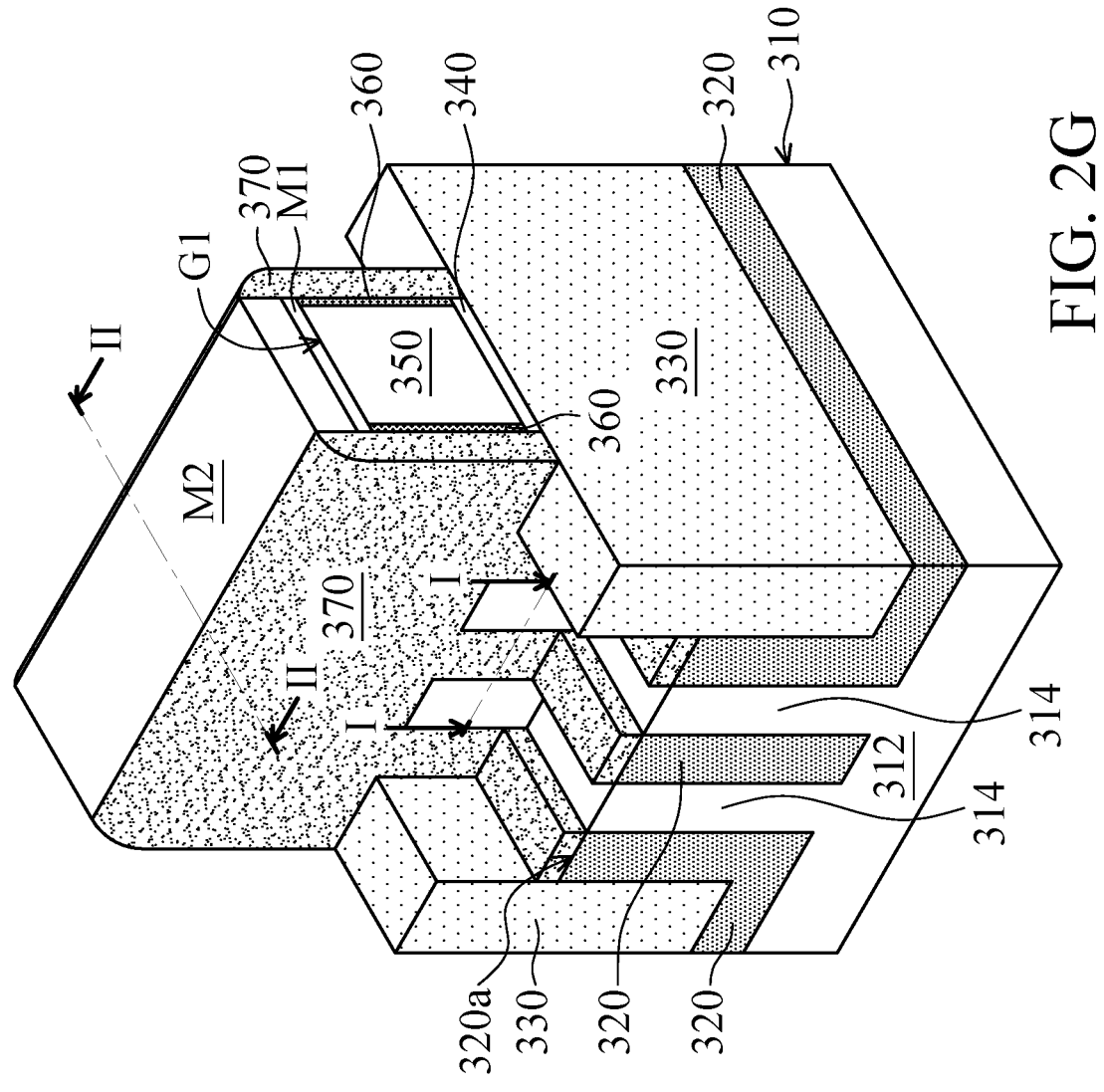
Figures 1, 2, 2G:
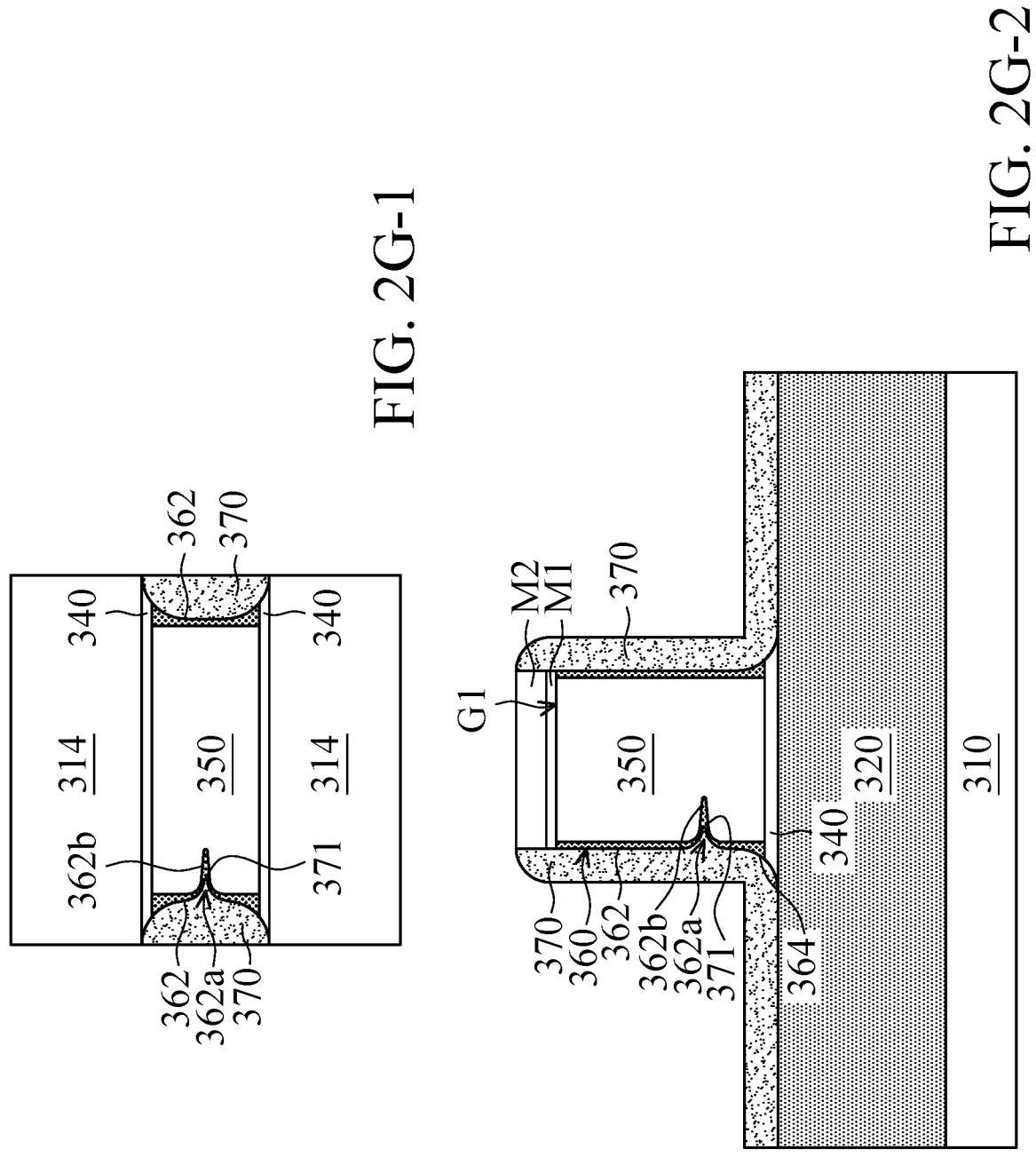

FIG. 2G-1 is a cross-sectional view illustrating the semiconductor device structure along a sectional line I-I in FIG. 2G, in accordance with some embodiments. FIG. 2G-2 is a cross-sectional view illustrating the semiconductor device structure along a sectional line II-II in FIG. 2G, in accordance with some embodiments.

As shown in FIGS. 2G, 2G-1, and 2G-2, portions of the spacer layer 370a and upper portions of the fins 314 are removed, in accordance with some embodiments. After the removal process, the spacer layer 370a remaining over opposite sidewalls of the gate stack G1, opposite sidewalls of the mask layers M1 and M2, and the top surfaces 320a of the dielectric layer 320 forms a spacer 370, in accordance with some embodiments.

The spacer 370 covers the oxide layer 360, in accordance with some embodiments. The spacer 370 has a protruding portion 371 filling the recess 362a of the oxide film 362, in accordance with some embodiments. The removal process includes an etching process, such as an anisotropic etching process, in accordance with some embodiments. The anisotropic etching process includes a dry etching process, in accordance with some embodiments.

In some other embodiments, the spacer 370 is a multi-layered structure. The spacer 370 includes layers, in accordance with some embodiments. The layers are made of different materials, in accordance with some embodiments.

Figure 2H:
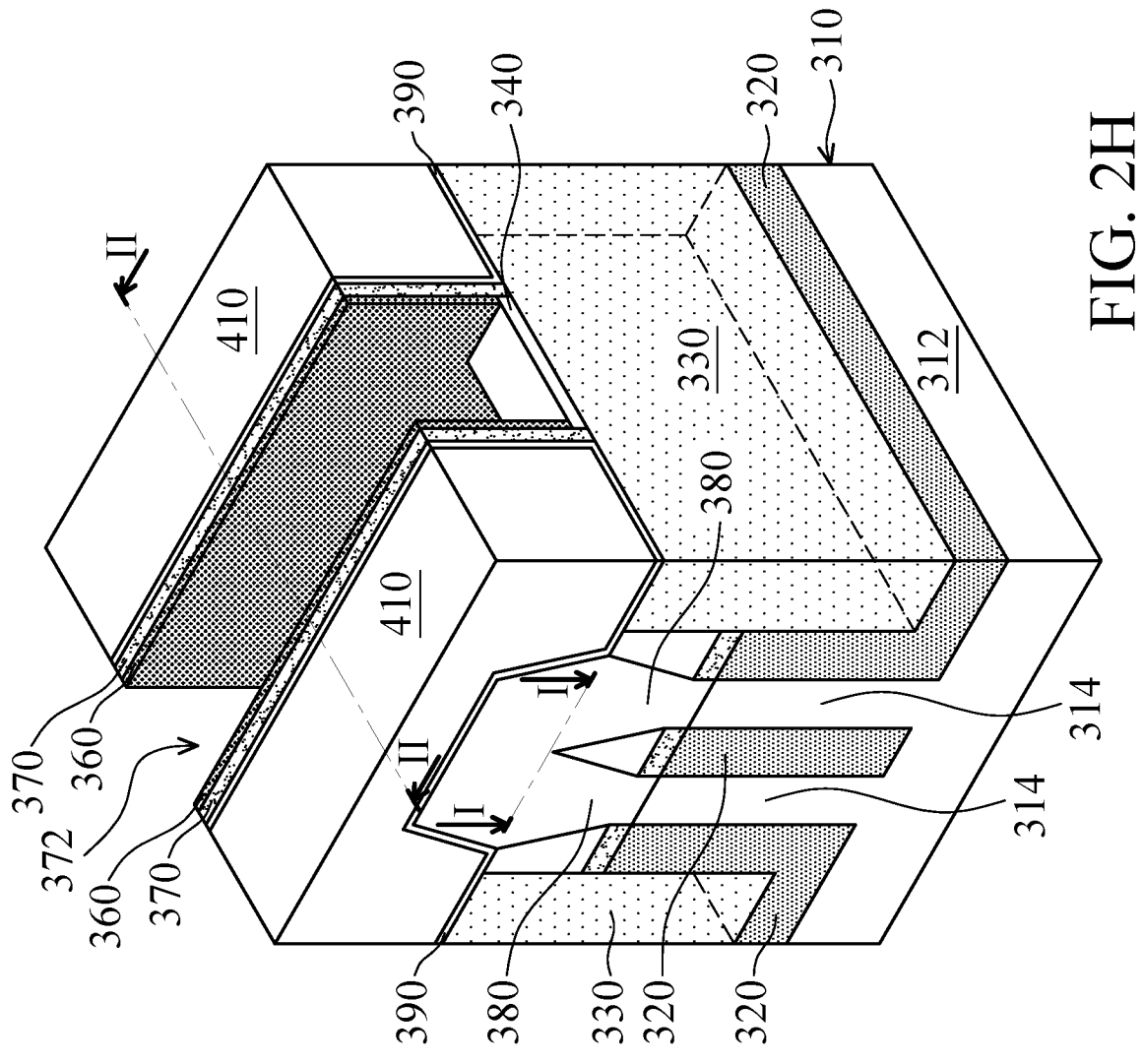
Figures 1, 2, 2H:
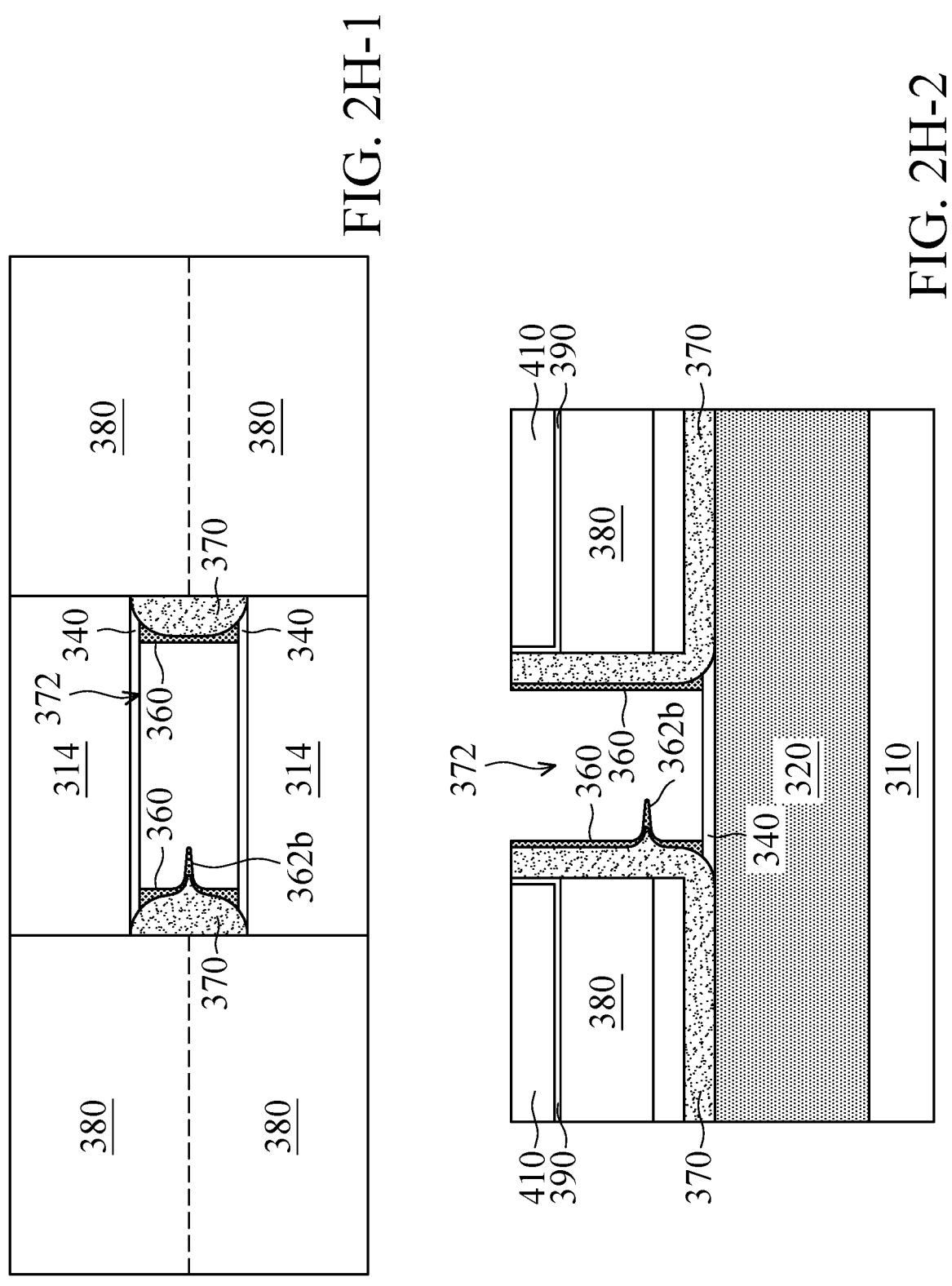

FIG. 2H-1 is a cross-sectional view illustrating the semiconductor device structure along a sectional line I-I in FIG. 2H, in accordance with some embodiments. FIG. 2H-2 is a cross-sectional view illustrating the semiconductor device structure along a sectional line II-II in FIG. 2H, in accordance with some embodiments.

As shown in FIGS. 2H, 2H-1, and 2H-2, source/drain structures 380 are respectively formed over the fins 314, in accordance with some embodiments. The two adjacent source/drain structures 380 are merged with each other, in accordance with some embodiments.

In some embodiments, the source/drain structures 380 are made of a semiconductor material (e.g., silicon) with N-type dopants, such as the Group VA element, in accordance with some embodiments. The Group VA element includes phosphor (P), antimony (Sb), or another suitable Group VA material.

In some embodiments, the source/drain structures 380 are made of a semiconductor material (e.g., silicon germanium) with P-type dopants, such as the Group IIIA element, in accordance with some embodiments. The Group IIIA element includes boron or another suitable material. The source/drain structures 380 are formed using an epitaxial process, in accordance with some embodiments.

As shown in FIGS. 2H and 2H-2, an etch stop layer 390 is conformally formed over the source/drain structures 380, the dielectric fins 330, the spacer 370, and the mask layer M2 (as shown in FIG. 2G), in accordance with some embodiments. The etch stop layer 390 is made of an insulating material, such as a nitrogen-containing material (e.g., silicon nitride), in accordance with some embodiments.

The etch stop layer 390 is formed using a deposition process, such as a chemical vapor deposition (CVD) process, an atomic layer deposition (ALD) process, or a physical vapor deposition (PVD) process, in accordance with some embodiments.

As shown in FIGS. 2H and 2H-2, a dielectric layer 410 is formed over the etch stop layer 390, in accordance with some embodiments. The dielectric layer 410 is made of any suitable insulating material, such as silicon oxide, silicon oxynitride, borosilicate glass (BSG), phosphoric silicate glass (PSG), borophosphosilicate glass (BPSG), fluorinated silicate glass (FSG), a low-k material, a porous dielectric material, or a combination thereof. The dielectric layer 410 is formed by any suitable process, such as a CVD process, a spin-on process, a sputtering process, or a combination thereof, in accordance with some embodiments.

Afterwards, upper portions of the dielectric layer 410 and the etch stop layer 390 and the mask layers M1 and M2 are removed, in accordance with some embodiments. Thereafter, a gate replacement process is performed, in accordance with some embodiments.

As shown in FIGS. 2H, 2H-1, and 2H-2, the gate electrode 350 is removed, in accordance with some embodiments. After the removal process, a trench 372 is formed in the spacer 370, in accordance with some embodiments. In some embodiments, the removal process includes an etching process. The etching process includes a dry etching process or a wet etching process, in accordance with some embodiments.

Figure 2I:
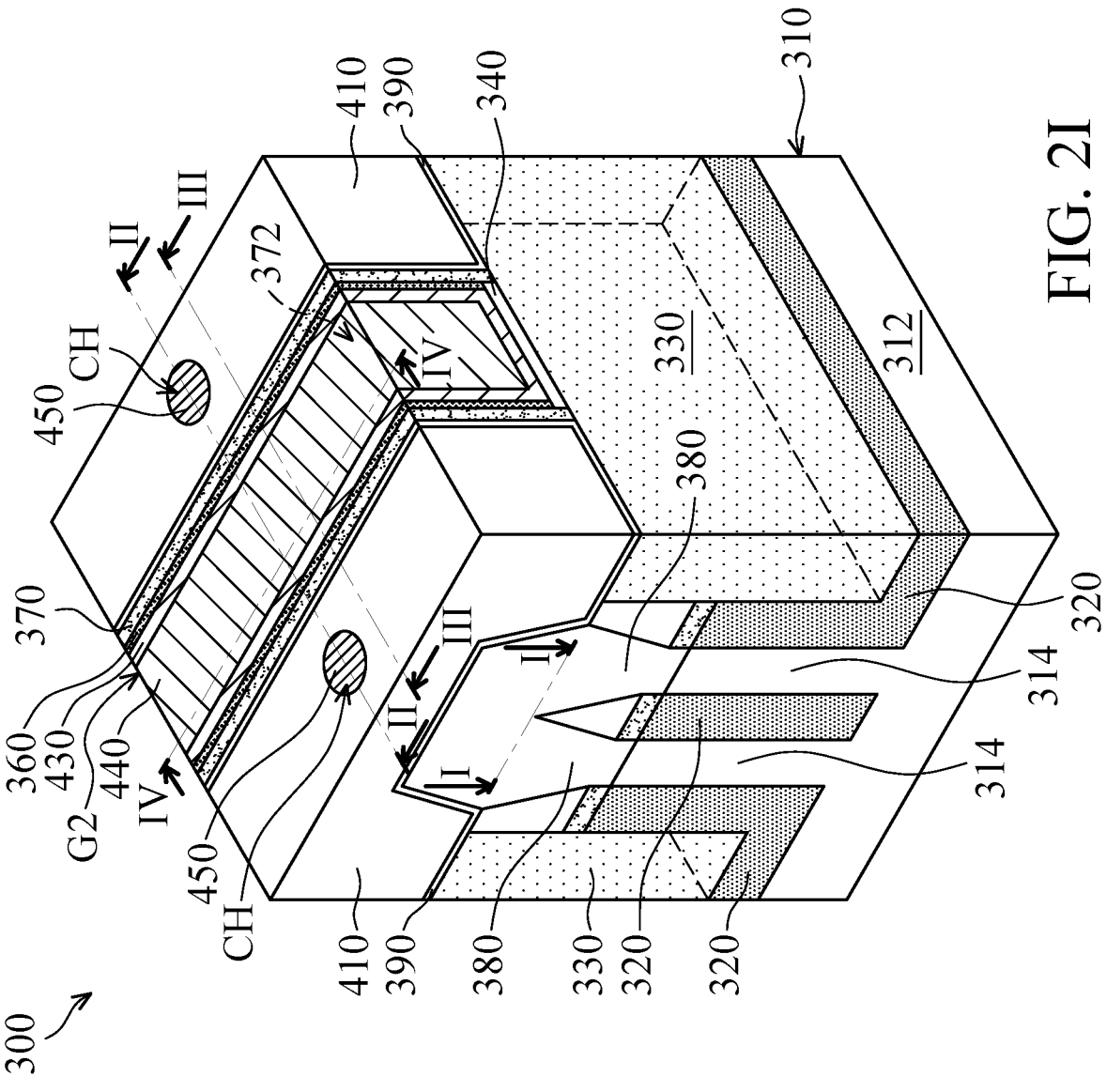
Figures 1, 2, 2I:
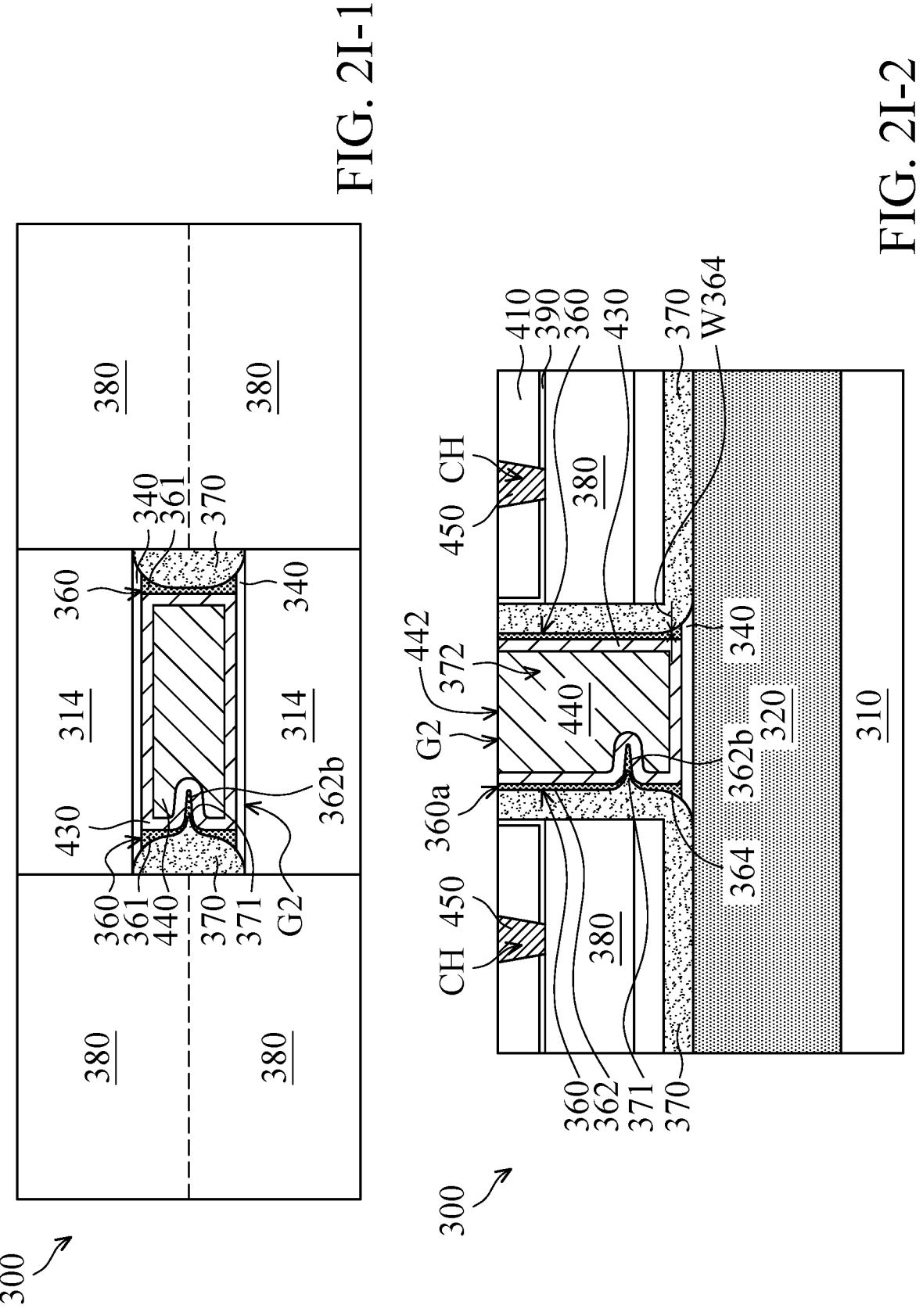

FIG. 2I-1 is a cross-sectional view illustrating the semiconductor device structure along a sectional line I-I in FIG. 2I, in accordance with some embodiments. FIG. 2I-2 is a cross-sectional view illustrating the semiconductor device structure along a sectional line II-II in FIG. 2I, in accordance with some embodiments. As shown in FIGS. 2I, 2I-1, and 2I-2, a work function metal layer 430 and a gate electrode 440 are sequentially formed in the trench 372 of the spacer 370, in accordance with some embodiments.

Figures 1, 1I, 2, 3, 4:
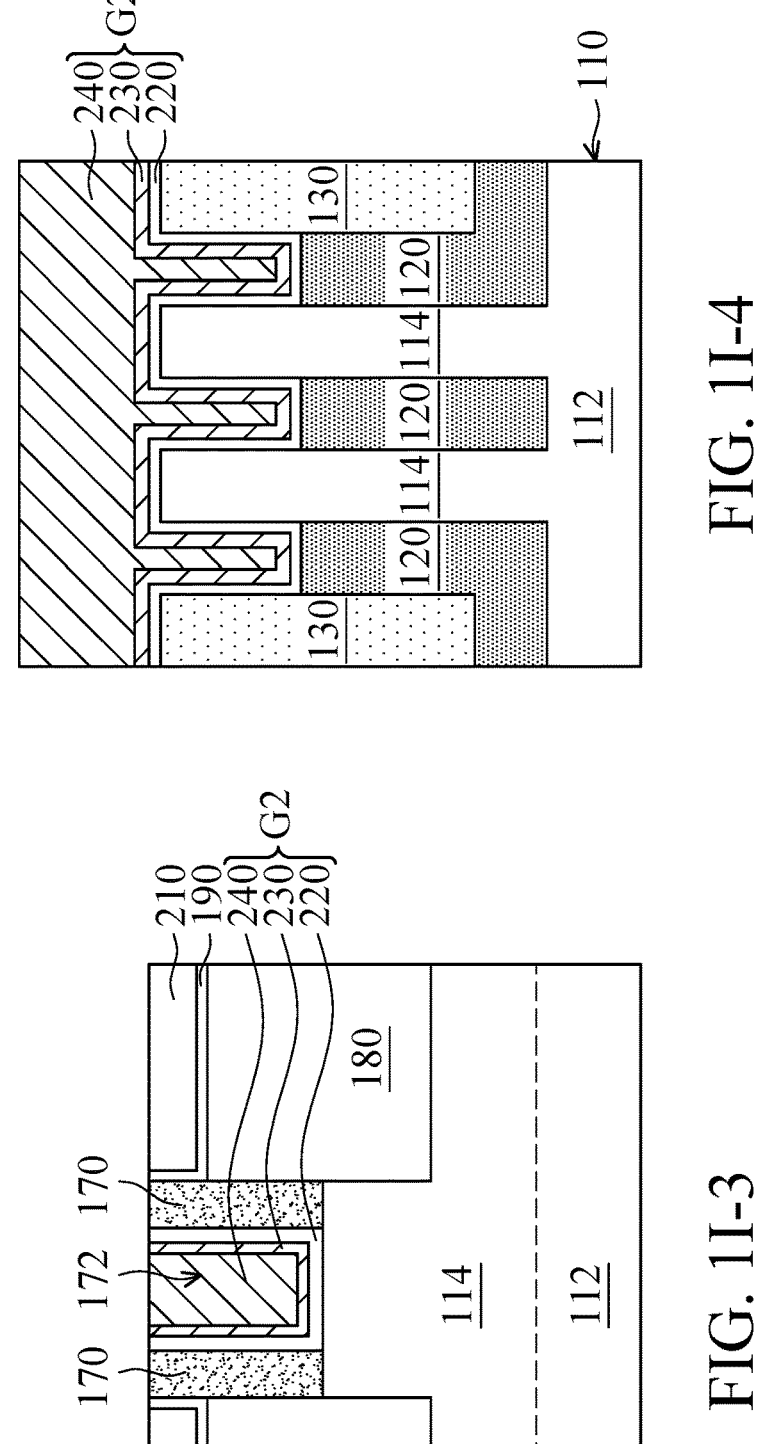

FIG. 2I-3 is a cross-sectional view illustrating the semiconductor device structure along a sectional line III-III in FIG. 2I, in accordance with some embodiments. FIG. 2I-4 is a cross-sectional view illustrating the semiconductor device structure along a sectional line IV-IV in FIG. 2I, in accordance with some embodiments.

As shown in FIGS. 2I, 2I-2, 2I-3, and 2I-4, the work function metal layer 430, the gate electrode 440, and the gate dielectric layer 340 together form a gate stack G2, in accordance with some embodiments. The work function metal layer 430 is conformally formed over the gate dielectric layer 340 and the oxide layer 360, in accordance with some embodiments.

As shown in FIGS. 2I-2 and 2I-4, the protruding portion 362b of the oxide film 362 surrounds the protruding portion 371 of the spacer 370, in accordance with some embodiments. The work function metal layer 430 is conformally formed over the protruding portion 362b, in accordance with some embodiments.

The work function metal layer 430 provides a desired work function for transistors to enhance device performance including improved threshold voltage. In the embodiments of forming an NMOS transistor, the work function metal layer 430 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

On the other hand, in the embodiments of forming a PMOS transistor, the work function metal layer 430 can be a p-type metal capable of providing a work function value suitable for the device, such as equal to or greater than about 4.8 eV. The p-type metal may be made of metal, metal carbide, metal nitride, other suitable materials, or a combination thereof. For example, the p-type metal is made of titanium, titanium nitride, other suitable materials, or combinations thereof. The work function metal layer 430 may also be made of hafnium, zirconium, titanium, tantalum, aluminum, metal carbides (e.g., hafnium carbide, or zirconium carbide), aluminides, ruthenium or a combination thereof.

The gate electrode 440 is formed over the work function metal layer 430, in accordance with some embodiments. The gate electrode 440 is also called a metal gate electrode, in accordance with some embodiments. The gate electrode 440 is made of a suitable metal material, such as aluminum, tungsten, gold, platinum, cobalt, other suitable metal, an alloy thereof, or a combination thereof, in accordance with some embodiments.

As shown in FIG. 2I-1, the oxide corner structure 361 is between the spacer 370 and the fin 314, in accordance with some embodiments. As shown in FIG. 2I-2, the protruding portion 371 of the spacer 370 extends into the oxide layer 360, in accordance with some embodiments. The protruding portion 362*b* of the oxide film 362 of the oxide layer 360 extends into the work function metal layer 430 and the gate electrode 440, in accordance with some embodiments. The work function metal layer 430 partially extends into the gate electrode 440, in accordance with some embodiments.

The top surface 360*a* of the oxide layer 360 and a top surface 442 of the gate electrode 440 are substantially coplanar, in accordance with some embodiments. The oxide footing structure 364 has a width W364, in accordance with some embodiments. The width W364 increases toward the substrate 310 or the dielectric layer 320, in accordance with some embodiments.

Thereafter, as shown in FIGS. 2I and 2I-2, portions of the dielectric layer 410 and the etch stop layer 390 are removed to form contact holes CH in the dielectric layer 410 and the etch stop layer 390, in accordance with some embodiments. The contact holes CH pass though the dielectric layer 410 and the etch stop layer 390, in accordance with some embodiments. The contact holes CH partially expose the source/drain structures 380 thereunder, in accordance with some embodiments.

As shown in FIGS. 2I and 2I-2, contact structures 450 are formed in the contact holes CH, in accordance with some embodiments. The contact structures 450 pass through the dielectric layer 410 and the etch stop layer 390 to connect to the source/drain structures 380 thereunder, in accordance with some embodiments.

The formation of the contact structures 450 includes depositing a conductive material layer (not shown) over the dielectric layer 410 and in the contact holes CH; and performing a chemical mechanical polishing (CMP) process over the conductive material layer to remove the conductive material layer outside of the contact holes CH, in accordance with some embodiments.

The contact structures 450 are made of tungsten (W) or another suitable conductive material, in accordance with some embodiments. In this step, a semiconductor device structure 300 is substantially formed, in accordance with some embodiments. The semiconductor device structure 300 includes an input/output (IO) device, in accordance with some embodiments.

In some embodiments (not shown), the semiconductor device structures 200 and 300 are formed over the same substrate, and the semiconductor device structures 200 and 300 are respectively in a core region and an input/output (IO) region of the substrate.

Figure 3A:
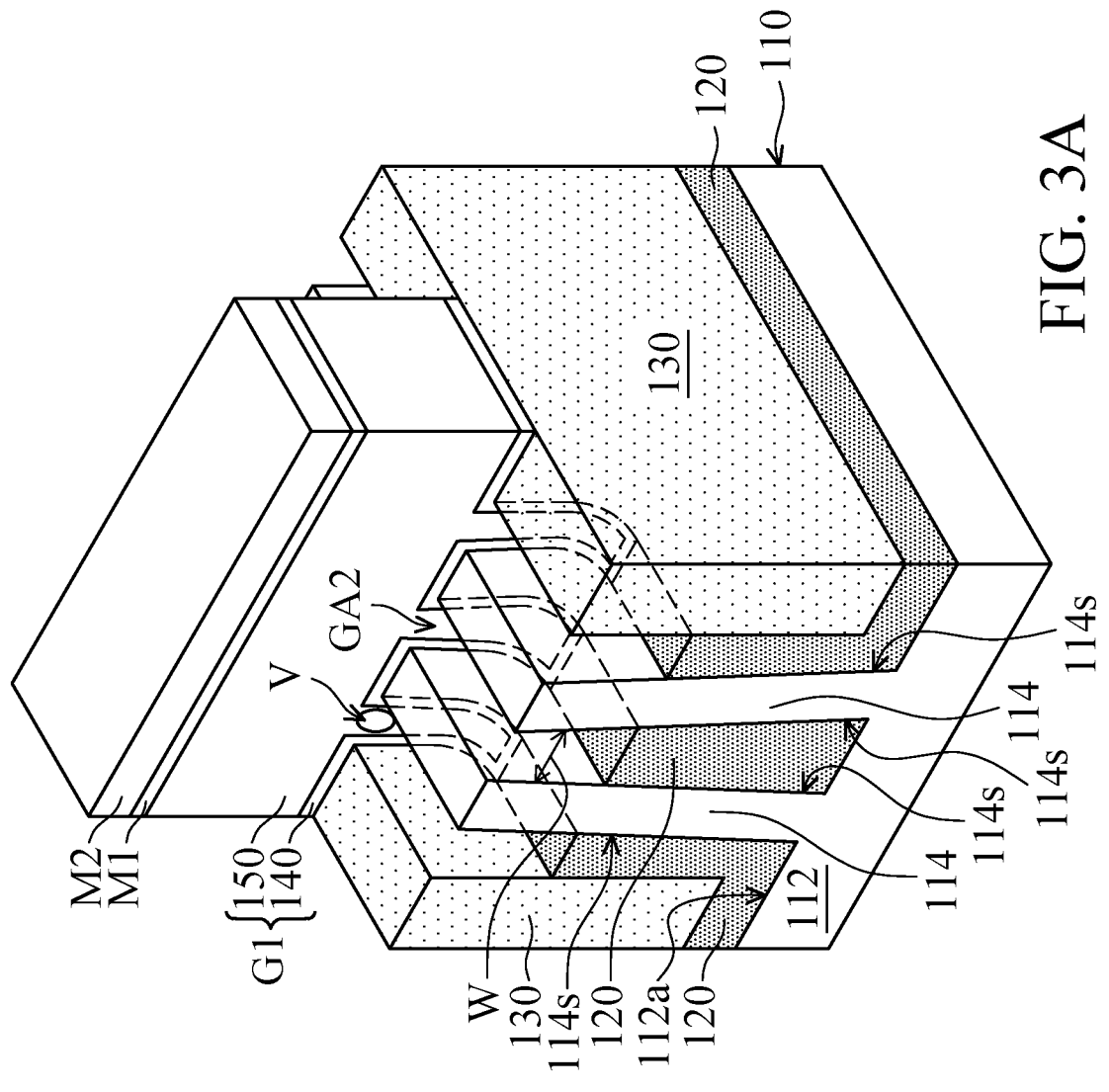
FIGS. 3A-3B are perspective views of various stages of a process for forming a semiconductor device structure, in accordance with some embodiments.
Figure 3B:
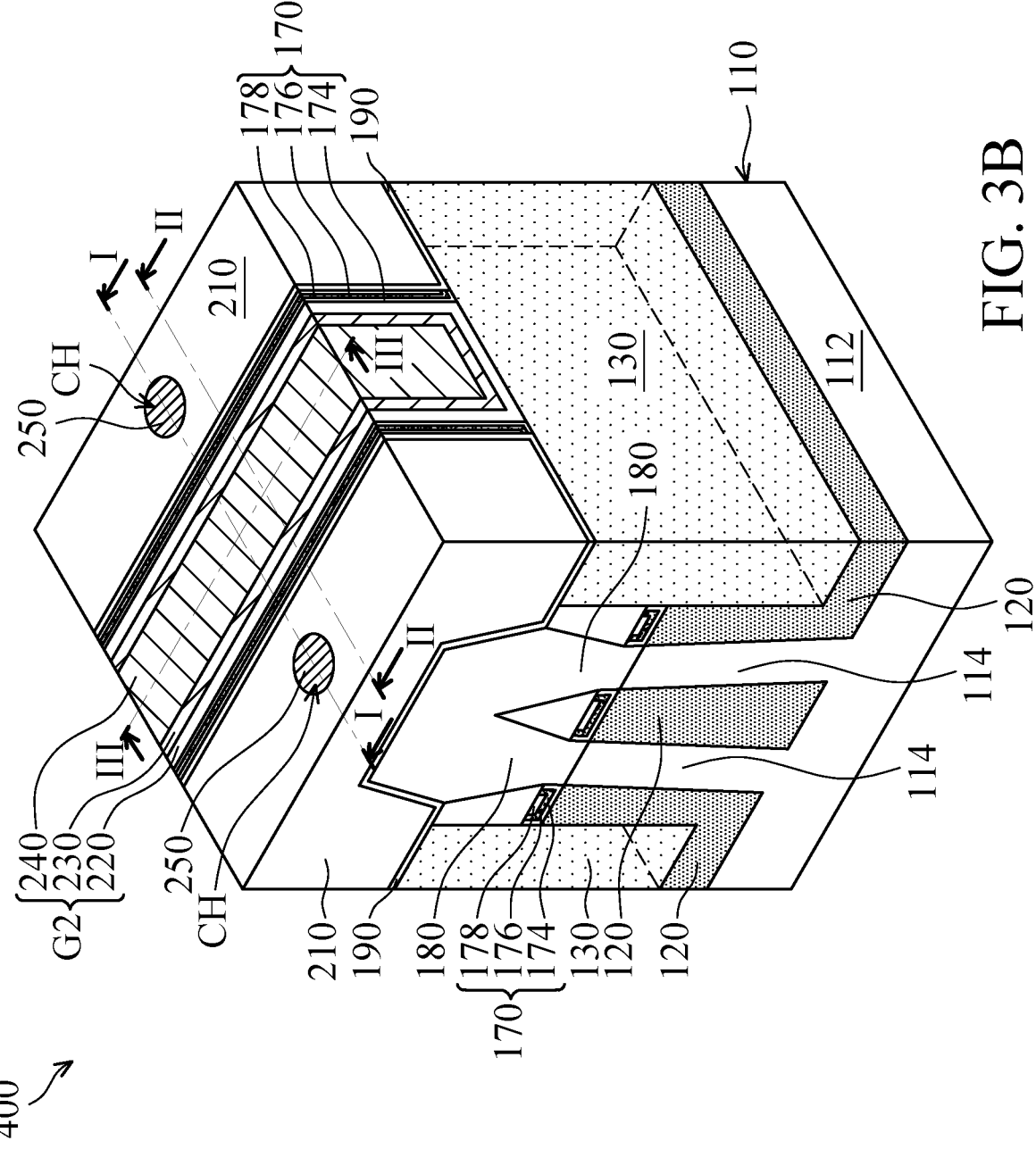
Figures 1, 3B:
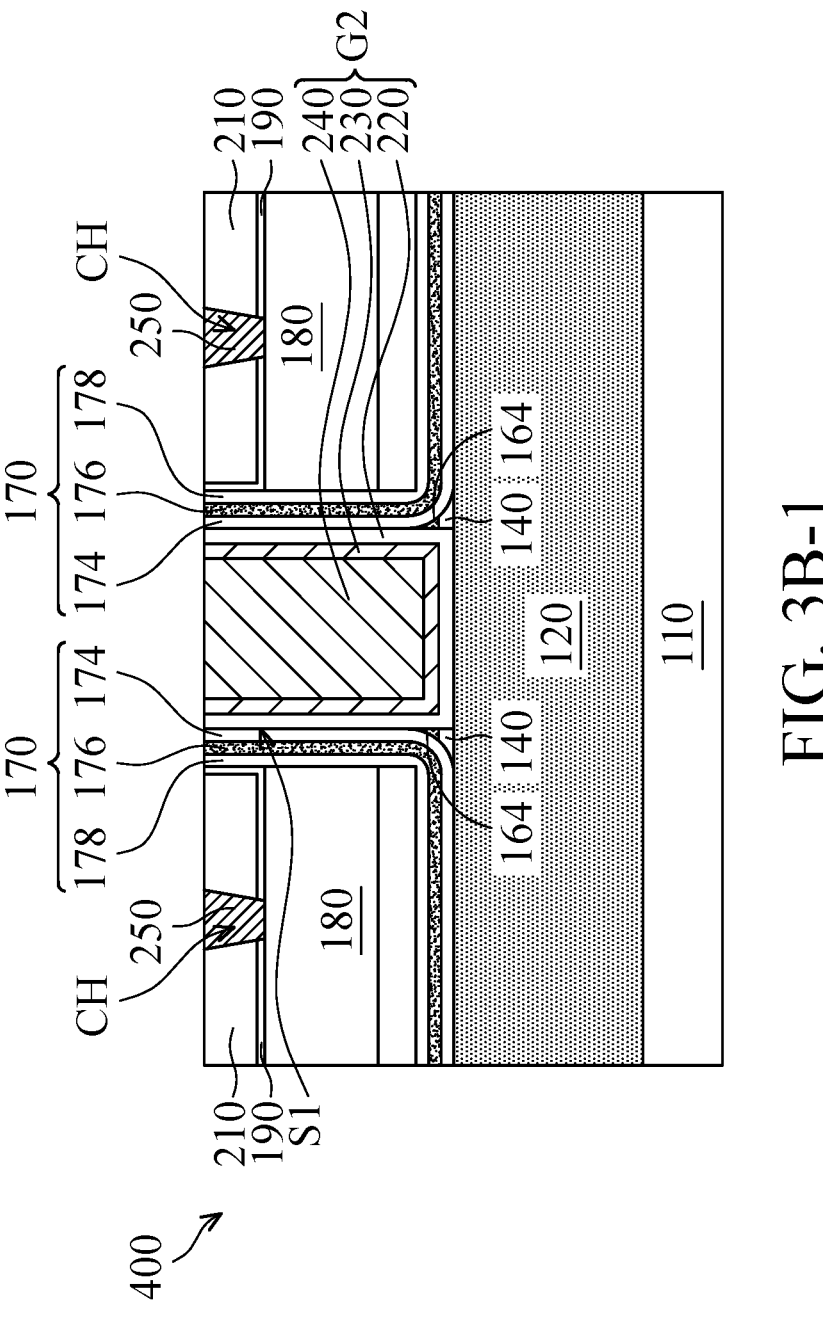
Figures 2, 3, 3B:
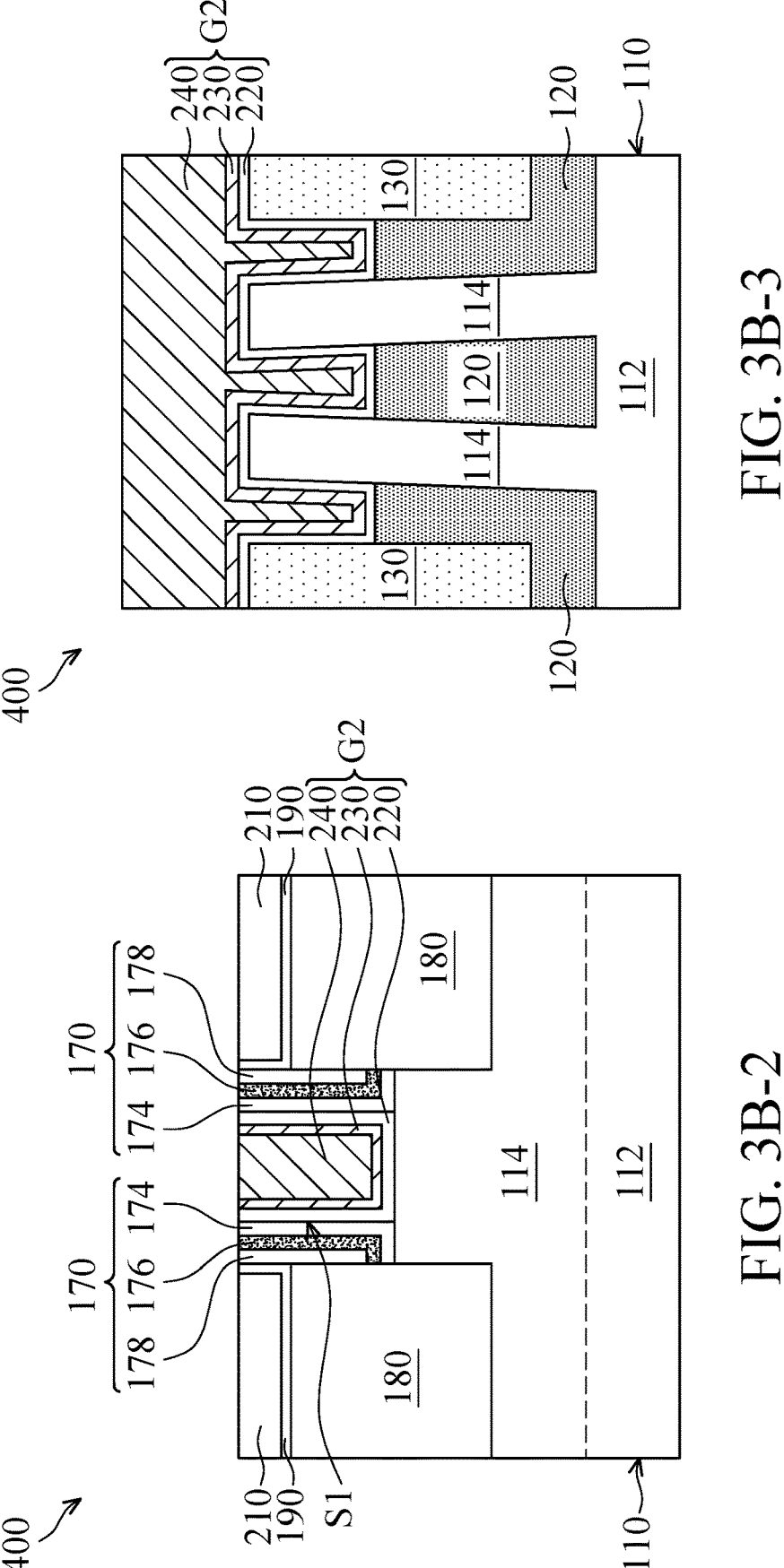

FIGS. 3A-3B are perspective views of various stages of a process for forming a semiconductor device structure, in accordance with some embodiments. As shown in FIG. 3A, the semiconductor device structure is similar to the semiconductor device structure of FIG. 1D, except that the sidewalls 114*s* of the fins 114 of the semiconductor device structure of FIG. 3A are sloped sidewalls with respect to the top surface 112*a* of the base 112 of the substrate 110, in accordance with some embodiments.

The width W of the gap GA2 between the fins 114 increases toward the base 112, in accordance with some embodiments. Furthermore, the void V of the gate electrode 150 is between the fin 114 and the dielectric fin 130, in accordance with some embodiments.

FIG. 3B-1 is a cross-sectional view illustrating the semiconductor device structure along a sectional line I-I in FIG. 3B, in accordance with some embodiments. FIG. 3B-2 is a cross-sectional view illustrating the semiconductor device structure along a sectional line II-II in FIG. 3B, in accordance with some embodiments. FIG. 3B-3 is a cross-sectional view illustrating the semiconductor device structure along a sectional line III-III in FIG. 3B, in accordance with some embodiments.

As shown in FIGS. 3B, 3B-1, 3B-2, and 3B-3, the steps of FIGS. 1E-1I are performed to form the oxide footing structure 164, the spacer 170, the source/drain structures 180, the etch stop layer 190, the dielectric layer 210, the gate stack G2, and the contact structures 250, in accordance with some embodiments. In this step, a semiconductor device structure 400 is substantially formed, in accordance with some embodiments.

The spacer 170 includes layers 174, 176, and 178, in accordance with some embodiments. The layer 174 conformally covers the fins 114, the sidewalls S1 of the gate stack G2, the dielectric layer 120, the oxide footing structure 164, and the gate dielectric layer 140, in accordance with some embodiments. The layer 176 conformally covers the layer 174, in accordance with some embodiments. The layer 178 conformally covers the layer 176, in accordance with some embodiments.

The layers 174, 176, and 178 are made of different materials, thereby improving an etching selectivity between the layers 174, 176, and 178, in accordance with some embodiments. The layer 174 is made of silicon oxycarbonitride (SiOCN), in accordance with some embodiments. The layer 176 is made of silicon oxynitride, in accordance with some embodiments. The layer 178 is made of silicon nitride, in accordance with some embodiments.

In some embodiments, the semiconductor device structures 200, 300 and 400 are able to be used in high-performance computing (HPC) devices. The process for forming the semiconductor device structure 200, 300 or 400 may be optionally used to from a fin field effect transistor (FinFET), a planar transistor, a gate-all-around (GAA) transistor, a forksheet transistor, and/or a complementary field-effect transistor (CFET).

Processes and materials for forming the semiconductor device structures 300 and 400 may be similar to, or the same as, those for forming the semiconductor device structure 200 described above. Elements designated by the same or similar reference numbers as those in FIGS. 1A to 3B-3 have the same or similar structures and the materials. Therefore, the detailed descriptions thereof will not be repeated herein.

In accordance with some embodiments, semiconductor device structures and methods for forming the same are provided. The methods (for forming the semiconductor device structure) perform an oxidation process to oxidize a side portion of a gate electrode to form an oxide layer over the gate electrode. The oxide layer is able to fill voids in the gate electrode, which prevents a spacer from filling into the voids. The oxide layer is able to be removed in a subsequent removal process of a gate dielectric layer. Therefore, the formation of the oxide layer improves the yield of a metal gate replacement process, which is performed after the removal process of the gate dielectric layer. As a result, the yield and the performance of the semiconductor device structures are also improved.

In accordance with some embodiments, a method for forming a semiconductor device structure is provided. The method includes forming a first gate stack over a substrate. The first gate stack includes a first gate electrode and a dielectric layer between the first gate electrode and the substrate, and the first gate electrode has a void. The method includes oxidizing a side portion of the first gate electrode to form an oxide layer over the first gate electrode. The oxide layer fills the void.

In accordance with some embodiments, a method for forming a semiconductor device structure is provided. The method includes forming a first gate stack over a substrate. The first gate stack includes a first gate electrode and a dielectric layer between the first gate electrode and the substrate, the first gate electrode has a side portion and a footing portion under the side portion, the footing portion is close to the substrate, and a width of the footing portion increases toward the substrate. The method includes oxidizing the footing portion and the side portion to form an oxide footing structure and an oxide film over the first gate electrode.

In accordance with some embodiments, a semiconductor device structure is provided. The semiconductor device structure includes a substrate. The semiconductor device structure includes a gate stack over the substrate. The semiconductor device structure includes an oxide footing structure over a lower portion of a sidewall of the gate stack. The oxide footing structure has a width increasing toward the substrate. The semiconductor device structure includes a spacer covering the sidewall of the gate stack and the oxide footing structure. The spacer is in direct contact with the oxide footing structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first gate stack over a substrate, wherein the substrate has a base and a fin over the base, the first gate stack is wrapped around the fin, the first gate stack comprises a gate electrode and a dielectric layer between the gate electrode and the substrate, and the gate electrode has a void;
    oxidizing a side portion of the gate electrode to form an oxide layer over the gate electrode, wherein the oxide layer has a first portion and a second portion, the first portion fills the void, and the second portion is adjacent to the fin;
    forming a spacer over the oxide layer;
    removing the gate electrode to form a trench in the spacer;
    removing the first portion of the oxide layer and a third portion of the dielectric layer; and forming a second gate stack in the trench of the spacer, wherein a first sidewall of the second portion of the oxide layer and a second sidewall of the spacer face the second gate stack and are connected to each other after the second gate stack is formed.

2. The method for forming the semiconductor device structure as claimed in claim 1, wherein the oxide layer has a recess, and the recess is substantially level with the void of the gate electrode.

3. The method for forming the semiconductor device structure as claimed in claim 2, wherein the spacer fills the recess.

4. The method for forming the semiconductor device structure as claimed in claim 1, wherein the spacer partially extends into the second gate stack.

5. A method for forming a semiconductor device structure, comprising:
    forming a first gate stack over a substrate, wherein the first gate stack comprises a gate electrode and a dielectric layer between the gate electrode and the substrate, the gate electrode has a side portion and a footing portion under the side portion, the footing portion is between the side portion and the substrate, and a width of the footing portion increases toward the substrate;
    oxidizing the footing portion and the side portion to form an oxide footing structure and an oxide film over the gate electrode;
    forming a spacer over the oxide film and the oxide footing structure;
    removing the gate electrode to form a trench in the spacer;
    removing the oxide film and a first portion of the dielectric layer; and
    forming a second gate stack in the trench of the spacer, wherein a first sidewall of the oxide footing structure and a second sidewall of the spacer face the second gate stack and are connected to each other after the second gate stack is formed.

6. A method for forming a semiconductor device structure, comprising:
    forming a gate stack over a substrate, wherein the gate stack comprises a gate electrode and a dielectric layer between the gate electrode and the substrate;
    oxidizing a side portion of the gate electrode to form an oxide film over a first sidewall of the gate electrode, wherein the oxide film has a protruding portion extending into the gate electrode; and
    forming a spacer over the oxide film, wherein the spacer has a second sidewall and a protruding part protruding from the second sidewall, and a first thickness of the protruding part decreases toward the protruding portion of the oxide film.

7. The method for forming the semiconductor device structure as claimed in claim 6, wherein a second thickness of the protruding portion increases in a direction toward the first sidewall of the gate electrode.

8. The method for forming the semiconductor device structure as claimed in claim 6, wherein the protruding portion laterally extends into the gate electrode.

9. The method for forming the semiconductor device structure as claimed in claim 6, wherein the protruding portion has a stick shape.

10. The method for forming the semiconductor device structure as claimed in claim 6, wherein the second sidewall of the spacer is a curved sidewall.

11. The method for forming the semiconductor device structure as claimed in claim 1, wherein the second portion of the oxide layer has a triangle shape after the first portion of the oxide layer and the third portion of the dielectric layer are removed.

12. The method for forming the semiconductor device structure as claimed in claim 1, wherein a fourth portion of the dielectric layer remains between the second portion of the oxide layer and the fin after the first portion of the oxide film and the third portion of the dielectric layer are removed.

13. The method for forming the semiconductor device structure as claimed in claim 12, wherein the fourth portion of the dielectric layer has a trapezoid shape.

14. The method for forming the semiconductor device structure as claimed in claim 12, wherein a third sidewall of the fourth portion of the dielectric layer faces the second gate stack, and the first sidewall of the second portion of the oxide layer is connected to the third sidewall.

15. The method for forming the semiconductor device structure as claimed in claim 14, wherein a fourth sidewall of the second portion of the oxide layer and a fifth sidewall of the fourth portion of the dielectric layer face away from the second gate stack and are connected to each other.

16. The method for forming the semiconductor device structure as claimed in claim 1, wherein the second portion of the oxide layer is between the spacer and the fin after the first portion of the oxide layer and the third portion of the dielectric layer are removed.

17. The method for forming the semiconductor device structure as claimed in claim 5, wherein the oxide footing structure is between the spacer and the substrate.

18. The method for forming the semiconductor device structure as claimed in claim 5, wherein a second portion of the dielectric layer remains between the oxide footing structure and the substrate after the oxide film and the first portion of the dielectric layer are removed.

19. The method for forming the semiconductor device structure as claimed in claim 18, wherein the second portion of the dielectric layer has a trapezoid shape.

20. The method for forming the semiconductor device structure as claimed in claim 18, wherein the second portion of the dielectric layer has a third sidewall facing the second gate stack and connected to the first sidewall of the oxide footing structure.

* * * * *